US010510910B2

(12) United States Patent
Wu et al.

(10) Patent No.: US 10,510,910 B2
(45) Date of Patent: Dec. 17, 2019

(54) IMAGE SENSOR WITH AN ABSORPTION ENHANCEMENT SEMICONDUCTOR LAYER

(71) Applicant: Taiwan Semiconductor Manufacturing Co., Ltd., Hsin-Chu (TW)

(72) Inventors: Ming-Chi Wu, Kaohsiung (TW); Chien Nan Tu, Kaohsiung (TW); Kun-Yu Lin, Tainan (TW); Shih-Shiung Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 80 days.

(21) Appl. No.: 15/877,535

(22) Filed: Jan. 23, 2018

(65) Prior Publication Data
US 2019/0148570 A1  May 16, 2019

Related U.S. Application Data
(60) Provisional application No. 62/585,044, filed on Nov. 13, 2017.

(51) Int. Cl.
*H01L 31/028* (2006.01)
*H01L 31/0236* (2006.01)
(Continued)

(52) U.S. Cl.
CPC .. *H01L 31/02363* (2013.01); *H01L 27/14683* (2013.01); *H01L 31/028* (2013.01);
(Continued)

(58) Field of Classification Search
CPC ......... H01L 27/14683; H01L 31/02363; H01L 31/028; H01L 31/109; H01L 31/1804
(Continued)

(56) References Cited

U.S. PATENT DOCUMENTS

2014/0048852 A1  2/2014  Kurogi
2015/0287761 A1  10/2015  Huang et al.
2015/0325721 A1  11/2015  Toda

OTHER PUBLICATIONS

Bob, et al. "Fabrication and Subband Gap Optical Properties of Silicon Supersaturated with Chalcogens by Ion Implantation and Pulsed Laser Melting." Journal of Applied Physics 107, 123506 (2010).
(Continued)

*Primary Examiner* — Elias Ullah
(74) *Attorney, Agent, or Firm* — Eschweiler & Potashnik, LLC

(57) ABSTRACT

An image sensor with an absorption enhancement semiconductor layer is provided. In some embodiments, the image sensor comprises a front-side semiconductor layer, an absorption enhancement semiconductor layer, and a back-side semiconductor layer that are stacked. The absorption enhancement semiconductor layer is stacked between the front-side and back-side semiconductor layers. The absorption enhancement semiconductor layer has an energy bandgap less than that of the front-side semiconductor layer. Further, the image sensor comprises a plurality of protrusions and a photodetector. The protrusions are defined by the back-side semiconductor layer, and the photodetector is defined by the front-side semiconductor layer, the absorption enhancement semiconductor layer, and the back-side semiconductor layer.

20 Claims, 15 Drawing Sheets

(51) Int. Cl.
 *H01L 31/18* (2006.01)
 *H01L 27/146* (2006.01)
 *H01L 31/109* (2006.01)

(52) U.S. Cl.
 CPC ........ *H01L 31/109* (2013.01); *H01L 31/1804* (2013.01); *H01L 27/14612* (2013.01); *H01L 27/14621* (2013.01); *H01L 27/14627* (2013.01)

(58) Field of Classification Search
 USPC ...................................................... 257/187
 See application file for complete search history.

(56) References Cited

OTHER PUBLICATIONS

U.S. Appl. No. 15/609,325, filed May 31, 2017.
Zhou, et al. "Fast Flexible Electronics With Strained Silicon Nanomembranes." Scientific Reports | 3 : 1291 | DOI: 10.1038/srep01291. Published on Feb. 18, 2013.

IMAGE SENSOR WITH AN ABSORPTION ENHANCEMENT SEMICONDUCTOR LAYER

REFERENCE TO RELATED APPLICATION

This application claims the benefit of U.S. Provisional Application No. 62/585,044, filed on Nov. 13, 2017, the contents of which are incorporated herein by reference in their entirety.

BACKGROUND

Integrated circuits (ICs) with image sensors are used in a wide range of modern day electronic devices, such as, for example, cameras and cell phones. In recent years, complementary metal-oxide semiconductor (CMOS) image sensors have begun to see widespread use, largely replacing charge-coupled device (CCD) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
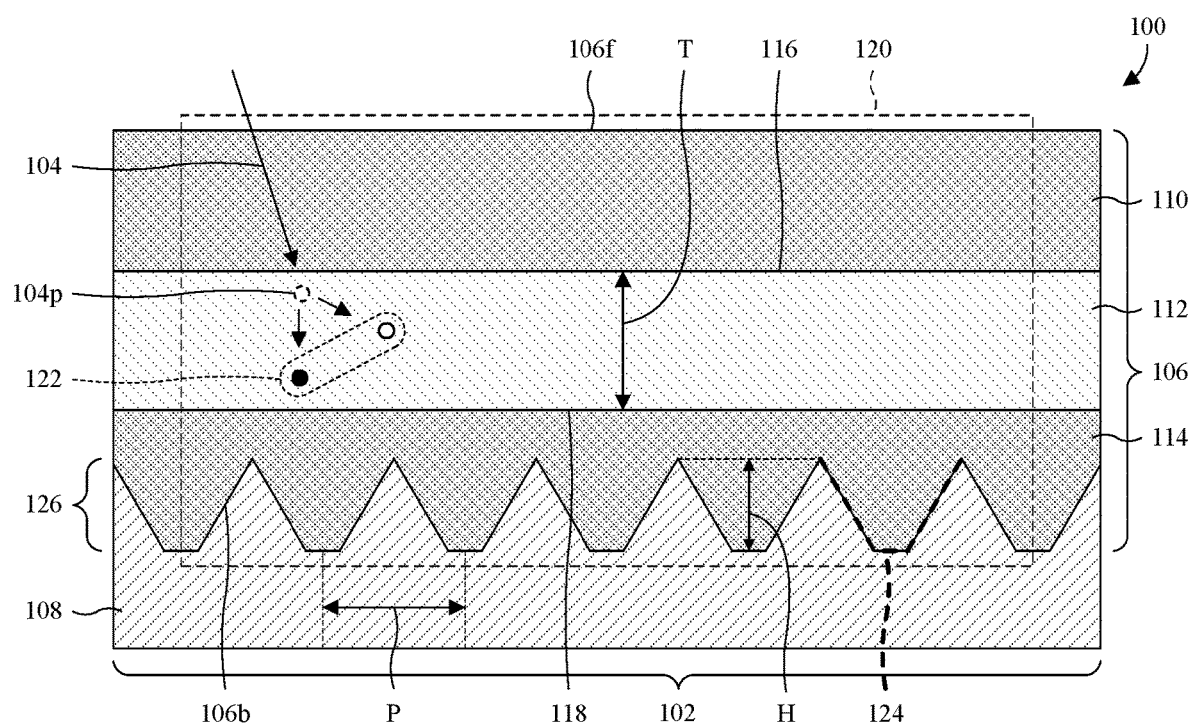
FIG. 1 illustrates a cross-sectional view of some embodiments of an image sensor comprising an absorption enhancement semiconductor layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an etch, a dielectric layer, or a substrate) may be referred to as a "first" element in some embodiments, the element may be referred to as a "second" element in other embodiments.

A complementary metal-oxide-semiconductor (CMOS) image sensor may comprise a semiconductor substrate of monocrystalline silicon and an array of pixel sensors arranged in the semiconductor substrate. The pixel sensors comprise respective photodetectors buried in the semiconductor substrate, and further comprise respective pixel transistors arranged on a surface of the semiconductor substrate. The photodetectors are configured to absorb incident radiation and to generate an electric signal corresponding to the incident radiation.

A challenge with the CMOS image sensor is that the CMOS image sensor cannot be used outdoors for radiation with a wavelength around 850 nanometers (hereafter 850 nanometer radiation). Namely, while the CMOS image may be used indoors for the 850 nanometer radiation, solar irradiance outdoors introduces noise that decreases the sensitivity of the CMOS image sensor to the 850 nanometer radiation. Further, the CMOS image sensor lacks sufficient sensitivity to the 850 nanometer radiation to compensate for the noise. Another challenge with the CMOS image sensor is that the monocrystalline silicon has a large energy bandgap, and hence a low absorption coefficient for high wavelength radiation. The high wavelength radiation includes, for example, radiation with a wavelength greater than about 900 nanometers. Therefore, the CMOS image sensor has poor quantum efficiency for high wavelength radiation unless enhanced. Quantum efficiency (QE) is the fraction of incident photons which contribute to the electric signal. For example, the CMOS image sensor may have a quantum efficiency below 10% for radiation with a wavelength around 940 nanometers, and/or may have a quantum efficiency around 0% for radiation with a wavelength greater than about 1100 nanometers.

One approach for enhancing the CMOS image sensor is to increase a thickness of the semiconductor substrate and the depth to which the photodetectors extend into the semiconductor substrate. The higher the wavelength of incident radiation, the higher the absorption depth. However, this is difficult with existing CMOS processes and adds cost to the manufacture of the CMOS image sensor. Further, increasing the depth to which the photodetectors extend into the semiconductor substrate increases cross talk and die size.

In view of the foregoing, various embodiments of the present application are directed towards an image sensor with an absorption enhancement semiconductor layer. In some embodiments, the image sensor comprises a front-side semiconductor layer, an absorption enhancement semiconductor layer, and a back-side semiconductor layer that are stacked. The absorption enhancement semiconductor layer is stacked between the front-side and back-side semiconductor layers, and has an energy bandgap less than that of the front-side semiconductor layer. In some embodiments, the image sensor further comprises a plurality of protrusions and a photodetector. The protrusions are defined by the back-side semiconductor layer. The photodetector is defined by the front-side and back-side semiconductor layers, as well as the absorption enhancement semiconductor layer.

Because the absorption enhancement semiconductor layer has a low energy bandgap relative to the front-side semiconductor layer, the absorption enhancement semiconductor layer has a high absorption coefficient relative to the front-side semiconductor layer. This, in turn, enhances absorption of incident radiation by the photodetector, such that the photodetector has a high QE. The high QE allows the photodetector to be used for high wavelength radiation greater than about 800 nanometers. For example, the photodetector may be used for radiation with a wavelength greater than about 900, 940, 1100, or 1375 nanometers. As another example, the photodetector may be used outdoors for radiation with a wavelength between about 840-860 nanometers, notwithstanding noise from solar irradiance. Further, the high QE allows the photodetector to be used for the high wavelength radiation without a large thickness. As such, costs, die size, crosstalk, or any combination of the foregoing is/are low.

With reference to FIG. 1, a cross-sectional view 100 of some embodiments of an image sensor comprising an absorption enhanced pixel sensor 102 is provided. The image sensor may be, for example, front-side illuminated (FSI) or back-side illuminated (BSI). Further, the image sensor may be, for example, a CMOS image sensor, and/or may, for example, be an integrated circuit (IC) die or chip. The absorption enhanced pixel sensor 102 is configured to absorb incident radiation 104 (e.g., light) with a high wavelength, and is defined by a composite substrate 106 and a passivation layer 108. The high wavelength may, for example, be greater than about 800, 850, 940, 1100, or 1375 nanometers, and/or may, for example, be between about 1.0-2.5 micrometers, between about 0.8-2.5 micrometers, or about 0.8-3.0 micrometers.

The passivation layer 108 is on a back-side surface 106b of the composite substrate 106 to protect the back-side surface 106b. The passivation layer 108 may be or comprise, for example, silicon dioxide, silicon nitride, a high κ dielectric, some other dielectric, or any combination of the foregoing. As used herein, a high κ dielectric may be, for example, a dielectric with a dielectric constant κ greater than about 3.9, 5, 10, or 20. The composite substrate 106 comprises a front-side semiconductor layer 110, an absorption enhancement semiconductor layer 112, and a back-side semiconductor layer 114.

The front-side semiconductor layer 110 is along and defines a front-side surface 106f of the composite substrate 106 that is opposite the back-side surface 106b of the composite substrate 106. The back-side semiconductor layer 114 is along and defines the back-side surface 106b of the composite substrate 106. In some embodiments, the back-side semiconductor layer 114 directly contacts the passivation layer 108. The front-side semiconductor layer 110 and the back-side semiconductor layer 114 may be or otherwise comprise, for example, silicon, some other semiconductor material, or any combination of the foregoing. In some embodiments, the front-side semiconductor layer 110 and/or the back-side semiconductor layer 114 is/are devoid of semiconductor atoms other than silicon atoms.

In some embodiments, the back-side semiconductor layer 114 is or comprises a semiconductor material with a systematic structure of pores (i.e., a porous semiconductor material). For example, the back-side semiconductor layer 114 may be or comprise nanoporous silicon, some other porous silicon, or some other porous semiconductor material. The pores may be, for example, micrometer sized pores, nanometer sized pores, smaller sized pores, or any combination of the foregoing. In some embodiments, the pores serve as a light trap for the incident radiation 104, thereby enhancing absorption. For example, angled sidewalls of a pore may make it difficult for radiation entering the pore to subsequently reflect out of the pore. Instead, the radiation is more likely to reflect around inside the pore until being absorbed.

The absorption enhancement semiconductor layer 112 is vertically stacked between the front-side semiconductor layer 110 and the back-side semiconductor layer 114. In some embodiments, the absorption enhancement semiconductor layer 112 directly contacts the front-side semiconductor layer 110 at a front-side heterojunction 116 and/or directly contacts the back-side semiconductor layer 114 at a back-side heterojunction 118. The absorption enhancement semiconductor layer 112 has a low energy bandgap to enhance absorption of the incident radiation 104. In some embodiments, the low energy bandgap is an energy bandgap less than about 1.00, 0.80, 0.60, 0.66, or 0.40 electron volt (eV). Further, in some embodiments, the low energy bandgap is an energy bandgap that is less than that of the front-side semiconductor layer 110 and/or the back-side semiconductor layer 114. For example, the absorption enhancement semiconductor layer 112 may have an energy bandgap less than about 1.0 eV, whereas the front-side semiconductor layer 110 may have an energy bandgap greater than about 1.1, 1.5, 2.0, or 5.0 eV. In some embodiments, a difference between an energy bandgap of the absorption enhancement semiconductor layer 112 and an energy bandgap of the front-side semiconductor layer 110 is about 0.46 eV or less, is about 0.5 eV or less, is between about 0.2-0.5 eV, or is between about 0.4-0.5 eV. The absorption enhancement semiconductor layer 112 may, for example, have such a difference with the front-side semiconductor layer 110 when the absorption enhancement semiconductor layer 112 is or comprises silicon germanium and the front-side semiconductor layer 110 is or comprises silicon. In some embodiments, the absorption enhancement semiconductor layer 112 also has a direct energy bandgap to further enhance absorption of the incident radiation 104. The direct energy bandgap may, for example, allow photons 104p from the incident radiation 104 to be absorbed without dependence on phonons (e.g., crystal vibrations). The absorption enhancement semiconductor layer 112 may be or comprise, for example, germanium, silicon germanium, silicon (e.g., monocrystalline silicon) doped with a chalcogen, some other semiconductor material with the low energy bandgap, or any combination of the foregoing. The chalcogen may be or comprise, for example, sulfur (e.g., S), selenium (e.g., Se), tellurium (e.g., Te), some other chalcogen, or any combination of the foregoing. In some embodiments where the absorption enhancement semiconductor layer 112 is or comprises silicon doped with the chalcogen, the absorption enhancement semiconductor layer 112 is devoid of semiconductor atoms other than silicon atoms. Further, in some embodiments where the absorption enhancement semiconductor layer 112 is or comprises silicon doped with the chalcogen, the absorption enhancement semiconductor layer 112 is doped in excess of the solubility limit of the chalcogen (i.e., is supersaturated) to facilitate sub-band gap absorption of the incident radiation 104.

In some embodiments, the absorption enhancement semiconductor layer 112 has a thickness T of about 10-3000 angstroms, 100-1500 angstroms, 1500-3000 angstroms, or a combination of the foregoing. In some of such embodiments, the absorption enhancement semiconductor layer 112 is or comprises $Si_{0.8}Ge_{0.2}$. In some of embodiments, the absorption enhancement semiconductor layer 112 is or comprises $Si_{0.8}Ge_{0.2}$, and/or has a thickness T of about 950-1050 angstroms, about 975-1025 angstroms, or about 1000 angstroms. In some embodiments, the front-side semiconductor layer 110 has the same crystalline orientation as the back-side semiconductor layer 114.

A photodetector 120 is defined by the composite substrate 106, including the absorption enhancement semiconductor layer 112. For example, the photodetector 120 may comprise a p-type semiconductor region (not shown), an n-type semiconductor region (not shown), and a photo junction (not shown). The p-type semiconductor region and the n-type semiconductor region are defined by the composite substrate 106, and the photo junction is defined by the p-type and n-type semiconductor regions. The photo junction may be or comprise, for example, a PN junction or a PIN junction. The photodetector 120 is configured to convert the incident radiation 104 to an electric signal. The electric signal may, for example, result from electron-hole pairs 122 generated in response to the composite substrate 106 absorbing photons 104p of the incident radiation 104. The photodetector 120 may be, for example, a photodiode or some other photodetector.

Because the absorption enhancement semiconductor layer 112 has a low energy bandgap, the absorption enhancement semiconductor layer 112 has a high absorption coefficient. This, in turn, enhances absorption of the incident radiation 104 by photodetector 120, such that the photodetector 120 has a high QE. The high QE allows the photodetector 120 to be used for high wavelength radiation greater than about 800 nanometers. For example, the photodetector 120 may be used for radiation with a wavelength greater than about 900, 940, 1100, or 1375 nanometers. As another example, the photodetector 120 may be used outdoors for radiation with a wavelength between about 840-860 nanometers, notwithstanding noise from solar irradiance. Further, the high QE allows the photodetector 120 to be used for the high wavelength radiation without the composite substrate 106 having a large thickness. As such, costs, die size, crosstalk, or any combination of the foregoing is/are low.

In some embodiments, a plurality of protrusions 124 is defined by the composite substrate 106, including the back-side semiconductor layer 114. For ease of illustration, only one of the protrusions 124 is labeled 124. The protrusions 124 are along the back-side surface 106b of the composite substrate 106, and at least partially define an absorption enhancement structure 126. The protrusions 124 are configured to prevent incident radiation from reflecting away from the photodetector 120. For example, the protrusions 124 may have angled sidewalls to prevent such reflectance. By preventing incident radiation from reflecting away from the photodetector 120, the protrusions 124 increase the amount of radiation absorbed by the photodetector 120, which increases the sensitivity of the photodetector 120.

In some embodiments, the protrusions 124 are in a periodic pattern or array. In some embodiments, the protrusions 124 each have a cone shape, a pyramid shape, or some other shape. In some embodiments, the protrusions 124 define a saw-toothed profile. In some embodiments, the protrusions 124 have a pitch P of about 0.01-8.0 micrometers, about 0.2-5.0 micrometers, about 1.0-3.0 micrometers, or any combination of the foregoing. In some embodiments, the protrusions 124 have a height H of about 0.2-20.0 micrometers, about 1.0-15.0 micrometers, about 5.0-10.0 micrometers, or any a combination of the foregoing.

In some embodiments where the back-side semiconductor layer 114 is or comprises the porous semiconductor material, the protrusions 124, and hence the absorption enhancement structure 126, are wholly or partially defined by the porous semiconductor material. In some embodiments, the combination of the porous semiconductor material and the protrusions 124 results in the absorption enhancement structure 126 having a direct energy band gap that enhances the quantum efficiency of the photodetector 120.

Figure 2A:
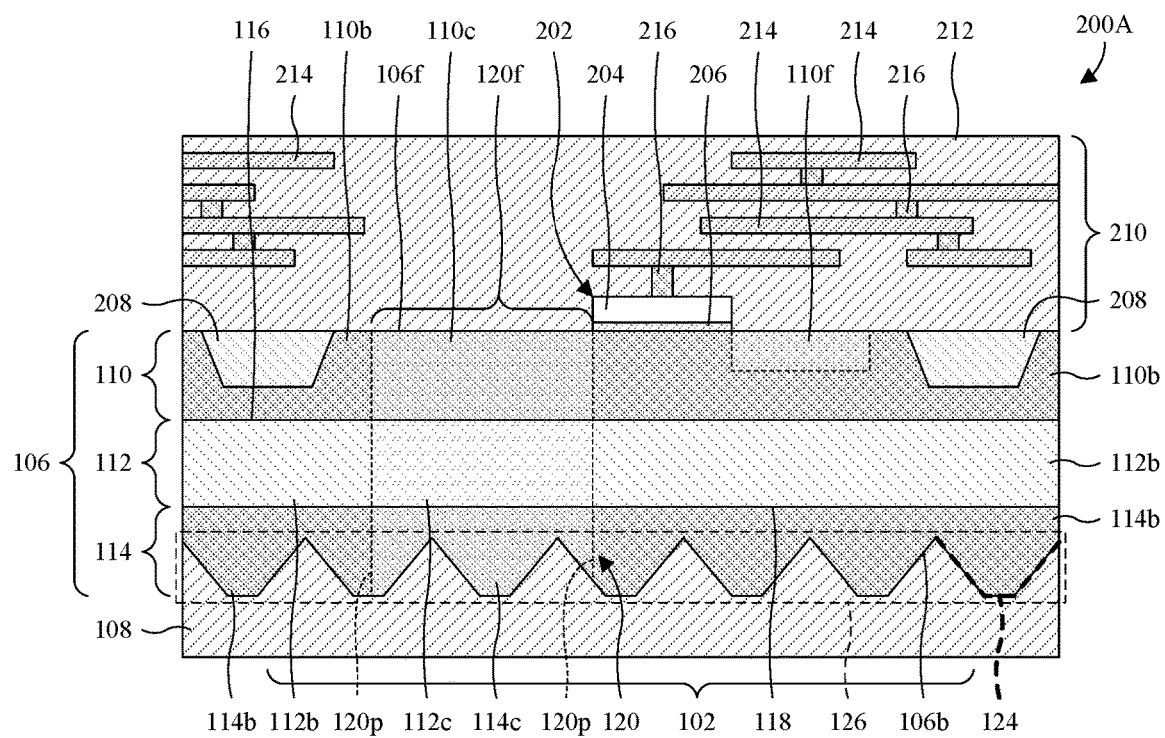
FIGS. 2A-2D illustrate cross-sectional views of various more detailed embodiments of the image sensor of FIG. 1.

With reference to FIG. 2A, a cross-sectional view 200A of some more detailed embodiments of the image sensor of FIG. 1 is provided. As illustrated, the front-side semiconductor layer 110 comprises a front-side charge collection region (CCR) 110c, a floating diffusion region (FDR) 110f, and a front-side bulk region 110b. The front-side bulk region 110b surrounds the front-side CCR 110c and is on opposite sides of the front-side CCR 110c. Further, the front-side bulk region 110b cups an underside of the FDR 110f. The FDR 110f and the front-side CCR 110c have a first doping type, and the front-side bulk region 110b has a second doping type opposite the first doping type. The first doping type and the second doping type may respectively be, for example, n-type and p-type, or vice versa. The front-side semiconductor layer 110 may be or comprise, for example, monocrystalline silicon, some other crystalline semiconductor material, or some other semiconductor material.

The absorption enhancement semiconductor layer 112 comprises an absorption enhancement CCR 112c and an absorption enhancement bulk region 112c, and the back-side semiconductor region 114 comprises a back-side CCR 114c and a back-side bulk region 114b. The absorption enhancement bulk region 112b surrounds the absorption enhancement CCR 112c and is on opposite sides of the absorption enhancement CCR 112c. The back-side bulk region 114b surrounds the back-side CCR 114c and is on opposite sides of the back-side CCR 114c. The absorption enhancement CCR 112c and the back-side CCR 114c have the first doping type, and the absorption enhancement bulk region 112b and the back-side bulk region 114b have the second doping type. The absorption enhancement semiconductor layer 112 is a semiconductor material with a low energy bandgap relative to the front-side semiconductor layer 110 and/or the back-side semiconductor layer 114. The absorption enhancement semiconductor 114 may be or comprise, for example, germanium, silicon germanium, crystalline silicon doped with a chalcogen, or some other semiconductor material. The back-side semiconductor region 114 may be or comprise, for example, silicon or some other semiconductor material. In some embodiments, the back-side semiconductor region 114 is or comprises nanoporous silicon or some other porous semiconductor material.

The photodetector 120 is defined by the front-side semiconductor layer 110, the absorption enhancement semiconductor layer 112, and the back-side semiconductor layer 114.

The photodetector 120 comprises a first semiconductor region 120f, a second semiconductor region (not labeled), and a photo junction 120p. The first semiconductor region 120f has an opposite doping as the second semiconductor region. The first semiconductor region 120f is defined by the front-side, absorption enhancement, and back-side CCRs 110c, 112c, 114c. In some embodiments, the first semiconductor region 120f extends continuously with a single doping type from the front-side surface 106f of the composite substrate 106 to the back-side surface 106b of the composite substrate 106. The second semiconductor region is defined by the front-side, absorption enhancement, and back-side bulk regions 110b, 112b, 114b and surrounds the first semiconductor region 120f. In some embodiments, the second semiconductor region extends continuously with a single doping type along sidewalls of the first semiconductor region, from the front-side surface 106f of the composite substrate 106 to the back-side surface 106b of the composite substrate 106. The photo junction 120p is defined by the first semiconductor region 120f and the second semiconductor region.

During use of the image sensor, radiation incident on the photodetector 120 is absorbed by the first semiconductor region 120f and the second semiconductor region. As discussed above, the absorption enhancement semiconductor layer 112 and the absorption enhancement structure 126 enhance such absorption. In response to absorbing a photon of the radiation, an electron-hole pair is generated. When the electron-hole pair is generated within a depletion region of the photo junction 120p or a diffusion region of the photo junction 120p, the electron of the pair and the hole of the pair diffuse and/or drift apart respectively to the first semiconductor region 120f and the second semiconductor region. For example, the electron of the pair diffuses and/or drifts to the first semiconductor region 120f, and the hole of the pair diffuses and/or drifts to the second semiconductor region, or vice versa. Such drifting may, for example, be caused by an electric field of the photo junction 120p. Since the second semiconductor region surrounds the first semiconductor region 120f, an electron or hole that diffuses and/or drifts to the first semiconductor region 120f becomes trapped in the first semiconductor region 120f, whereby charge accumulates.

One or more pixel transistors are on the front-side surface 106f of the composite substrate 106 to facilitate readout of the photodetector 120. For example, the one or more pixel transistors may comprise a transfer transistor 202, a source-follower transistor (not shown), a row select transistor (not shown), a reset transistor (not shown), some other pixel transistor, or any combination of the foregoing. The transfer transistor 202 is configured to selectively transfer charge accumulated in the first semiconductor region 120f of the photodetector 120 to the FDR 110f. In some embodiments, the transfer transistor 202 comprises a first source/drain region (not labeled), a gate electrode 204, a gate dielectric layer 206, and a second source/drain region. The first source/drain region may be, for example, wholly or partially defined by the front-side, absorption enhancement, and back-side CCRs 110c, 112c, 114c. The second source/drain region may be wholly or partially defined by, for example, the FDR 110f.

The gate electrode 204 is between and borders the first and second source/drain regions, and is vertically spaced over the composite substrate 106 by the gate dielectric layer 206. The gate electrode 204 may be or comprise, for example, copper, aluminum copper, some other metal, doped polysilicon, some other conductive material, or any combination of the foregoing. The gate dielectric layer 206 may be or comprise, for example, silicon dioxide, a high κ dielectric, some other dielectric, or any combination of the foregoing. The first and second source/drain regions are doped semiconductor regions of the composite substrate 106 having opposite doping types as surrounding regions of the composite substrate 106. For example, the first and second source/drain regions may be n-type or p-type.

In some embodiments, an isolation structure 208 extends into the front-side surface 106f of the composite substrate 106, and laterally surrounds the absorption enhanced pixel sensor 102, to electrically isolate the absorption enhanced pixel sensor 102 from surrounding devices (not shown). Such surrounding devices may include, for example, other pixel sensors, logic devices, or memory devices. Further, in some embodiments, the isolation structure 208 extends laterally in a closed path to completely enclose the absorption enhanced pixel sensor 102. For example, the isolation structure 208 may have a planar top layout that is ring shaped. Note that this is not visible within the cross-sectional view 200A of FIG. 2A. The isolation structure 208 may be or comprise, for example, a shallow trench isolation (STI) structure, a deep trench isolation (DTI) structure, an implant isolation region, or any combination of the foregoing.

An interconnect structure 210 overlies the composite substrate 106 and the one or more pixel transistors (e.g., the transfer transistor 202). Further, where the isolation structure 208 is present, the interconnect structure 210 overlies the isolation structure 208. The interconnect structure 210 comprises an interlayer dielectric (ILD) layer 212, a plurality of wires 214, and a plurality of vias 216. For ease of illustration, only some of the wires 214 are labeled 214 and only some of the vias 216 are labeled 216. The wires 214 and the vias 216 are alternatingly stacked in the ILD layer 212, and define conductive paths interconnecting the absorption enhanced pixel sensor 102 and surrounding devices (not shown). The vias 216 provide vertical routing for the conductive paths, and the wires 214 provide lateral routing for the conductive paths. The wires 214 may be or comprise, for example, aluminum copper, copper, aluminum, some other conductive material, or any combination of the foregoing. The vias 216 may be or comprise, for example, copper, tungsten, some other conductive material, or any combination of the foregoing. The ILD layer 212 may or comprise be, for example, silicon dioxide, silicon nitride, a low κ dielectric (e.g., fluorosilicate glass (FSG)), some other dielectric, or any combination of the foregoing. As used herein, a low κ dielectric may be, for example, a dielectric with a dielectric constant κ less than about 3.9, 3.0, 2.0, or 1.0.

Figure 2B:
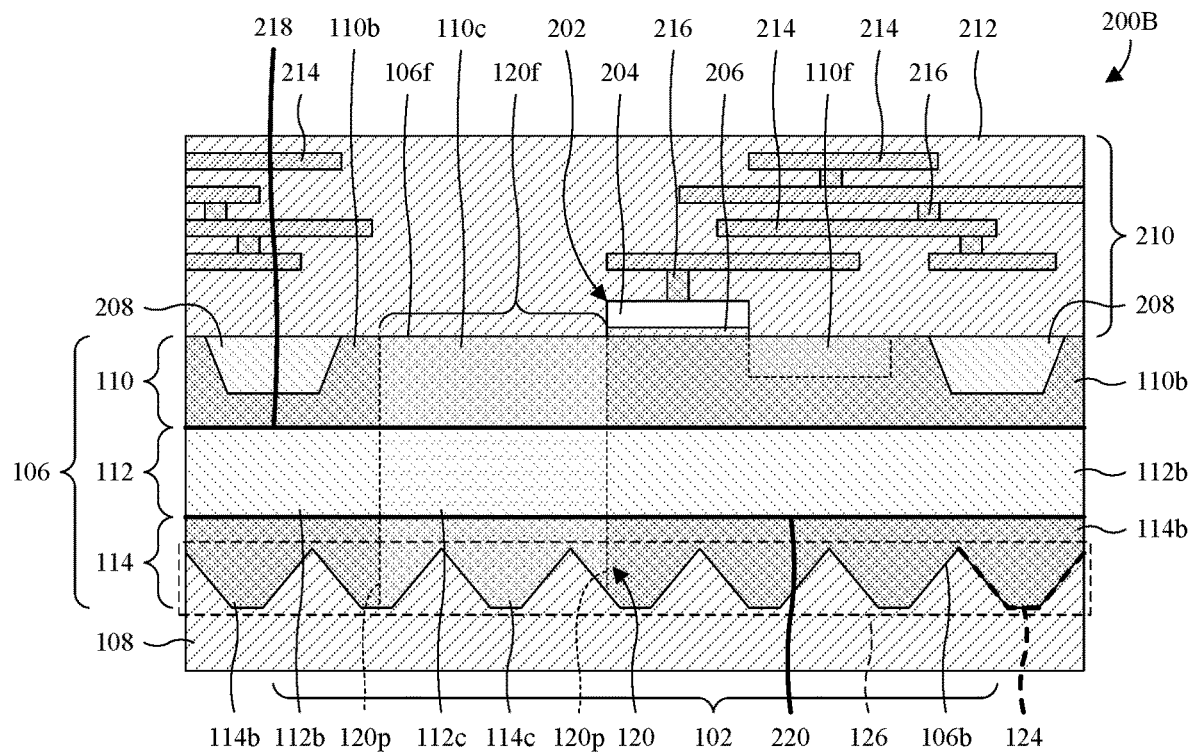

With reference to FIG. 2B, a cross-sectional view 200B of some other more detailed embodiments of the image sensor of FIG. 1 is provided. As illustrated, FIG. 2B is a variant of FIG. 2A having a front-side buffer layer 218 and a back-side buffer layer 220.

The front-side buffer layer 218 separates the front-side semiconductor layer 110 from the absorption enhancement semiconductor layer 112, and mitigates the effects of lattice mismatch between the absorption enhancement semiconductor layer 112 and the front-side semiconductor layer 110. Such effects may include, for example, physical strain, which leads to dark current and white pixels. The front-side buffer layer 218 may be or comprise, for example, the same semiconductor material as the absorption enhancement semiconductor layer 112, the same semiconductor material as the front-side semiconductor layer 110, some other semiconductor material, or any combination of the foregoing. Further, the front-side buffer layer 218 may, for example, comprise an elevated concentration of carbon relative to the absorption enhancement semiconductor layer 112 and/or the front-side semiconductor layer 110.

The back-side buffer layer 220 separates the back-side semiconductor layer 114 from the absorption enhancement semiconductor layer 112, and mitigates the effects of lattice mismatch between the absorption enhancement semiconductor layer 112 and the back-side semiconductor layer 114. The back-side buffer layer 220 may be or comprise, for example, the same semiconductor material as the absorption enhancement semiconductor layer 112, the same semiconductor material as back-side semiconductor layer 114, some other semiconductor material, or any combination of the foregoing. Further, the back-side buffer layer 220 may, for example, comprise an elevated concentration of carbon relative to the absorption enhancement semiconductor layer 112 and/or the back-side semiconductor layer 114.

The photodetector 120 is defined by the front-side semiconductor layer 110, the absorption enhancement semiconductor layer 112, and the back-side semiconductor layer 114, and is further defined by the front-side buffer layer 218 and the back-side buffer layer 220. The first semiconductor region 120$f$ of the photodetector 120 is defined by the front-side, absorption enhancement, and back-side CCRs 110$c$, 112$c$, 114$c$, and is further defined by first regions (not labeled) of the front-side and back-side buffer layers 218, 220 adjoining the front-side, absorption enhancement, and back-side CCRs 110$c$, 112$c$, 114$c$. The second semiconductor region (not labeled) of the photodetector 120 is defined by the front-side, absorption enhancement, and back-side bulk regions 110$b$, 112$b$, 114$b$, and is further defined by second regions (not labeled) of the front-side and back-side buffer layers 218, 220 adjoining the front-side, absorption enhancement, and back-side bulk regions 110$b$, 112$b$, 114$b$.

Figure 2C:
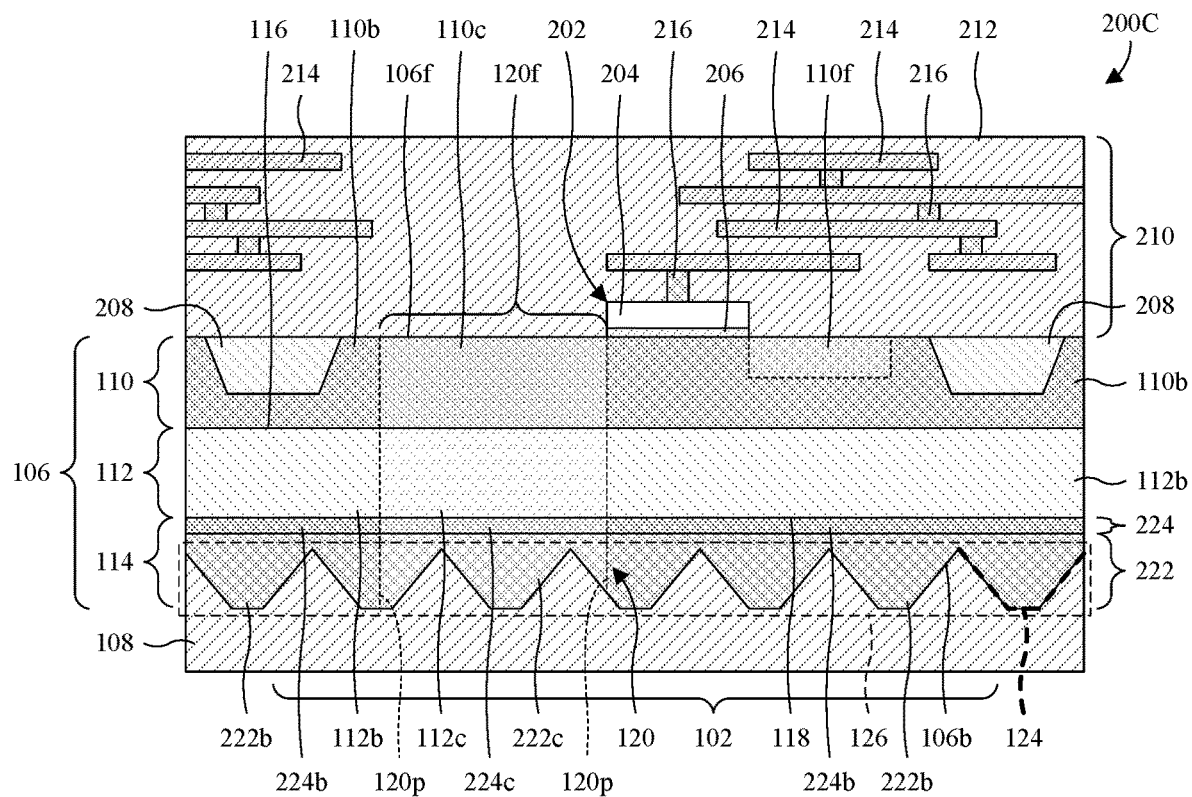

With reference to FIG. 2C, a cross-sectional view 200C of some other more detailed embodiments of the image sensor of FIG. 1 is provided. As illustrated, FIG. 2C is a variant of FIG. 2A in which the back-side semiconductor layer 114 comprises a porous semiconductor layer 222 and a crystalline semiconductor layer 224.

The porous semiconductor layer 222 underlies the crystalline semiconductor layer 224, and defines the back-side surface 106$b$ of the composite substrate 106. The porous semiconductor layer 222 comprises a porous CCR 222$c$ and a porous bulk region 222$b$. The porous bulk region 222$b$ surrounds the porous CCR 222$c$ and is on opposite sides of the porous CCR 222$c$. Further, the porous bulk region 222$b$ has an opposite doping type as the porous CCR 222$c$. The porous bulk region 222$b$ has same doping type as the front-side and absorption enhancement bulk regions 110$b$, 112$b$, and the porous CCR 222$c$ has the same doping type as the front-side and absorption enhancement CCRs 110$c$, 112$c$. The porous semiconductor layer 222 is or comprises nanoporous silicon or some other semiconductor material with a systematic structure of pores. The pores may be, for example, micrometer sized pores, nanometer sized pores, smaller sized pores, or any combination of the foregoing.

The crystalline semiconductor layer 224 separates the porous semiconductor layer 222 from the absorption enhancement semiconductor layer 112 and is without a systematic structure of the pores. For example, the crystalline semiconductor layer 224 may be free of a systematic structure of nanometer and/or micrometer sized pores. Further, the crystalline semiconductor layer 224 comprises a crystalline CCR 224$c$ and a crystalline bulk region 224$b$.

The crystalline bulk region 224$b$ surrounds the crystalline CCR 224$c$ and is on opposite sides of the crystalline CCR 224$c$. Further, the crystalline bulk region 224$b$ has an opposite doping type as the crystalline CCR 224$c$. The crystalline bulk region 224$b$ has the same doping type as the front-side and absorption enhancement bulk regions 110$b$, 112$b$, and the crystalline CCR 224$c$ has the same doping type as the front-side and absorption enhancement CCRs 110$c$, 112$c$. The crystalline semiconductor layer 224 may be, for example, monocrystalline silicon, polycrystalline silicon, or some other crystalline semiconductor material. Further, the crystalline semiconductor layer 224 may, for example, have an indirect energy bandgap.

The protrusions 124, and hence the absorption enhancement structure 126, are at least partially defined by the porous semiconductor layer 222. In some embodiments, pore size of the porous semiconductor layer 222 increases or decreases gradually from tips of the protrusions 124 towards the crystalline semiconductor layer 224. For example, pore size may decrease gradually from an average size of about 40 nanometers at the tips to an average size of about 8 nanometers at an interface at which the porous semiconductor layer 222 and the crystalline semiconductor layer 224 directly contact. In some embodiments, the absorption enhancement structure 126 has a direct energy bandgap due to the combination of the protrusions 124 and the porous semiconductor layer 222. This, in turn, allows the absorption enhancement structure 126 to absorb incident radiation without phonons (e.g., crystal vibrations).

The photodetector 120 is defined by the front-side semiconductor layer 110, the absorption enhancement semiconductor layer 112, the porous semiconductor layer 222, and the crystalline semiconductor layer 224. The first semiconductor region 120$f$ of the photodetector 120 is defined by the front-side, absorption enhancement, porous, and crystalline CCRs 110$c$, 112$c$, 222$c$, 224$c$. The second semiconductor region (not labeled) of the photodetector 120 is defined by the front-side, absorption enhancement, porous, and crystalline bulk regions 110$b$, 112$b$, 222$b$, 224$b$. Further, the photodetector 120 overlaps the absorption enhancement structure 126. Because the photodetector 120 overlaps the absorption enhancement structure 126, the quantum efficiency of the photodetector 120 is enhanced by the absorption enhancement structure 126. For example, the direct bandgap of the absorption enhancement structure 126 enhances the quantum efficiency of the photodetector 120.

While FIG. 2C illustrated the back-side semiconductor layer 114 as comprising both the porous semiconductor layer 222 and the crystalline semiconductor layer 224, the crystalline semiconductor layer 224 may be omitted in other embodiments. In some of such other embodiments, the porous semiconductor layer 222 may occupy the space presently occupied by the crystalline semiconductor layer 224 in FIG. 2C.

Figure 2D:
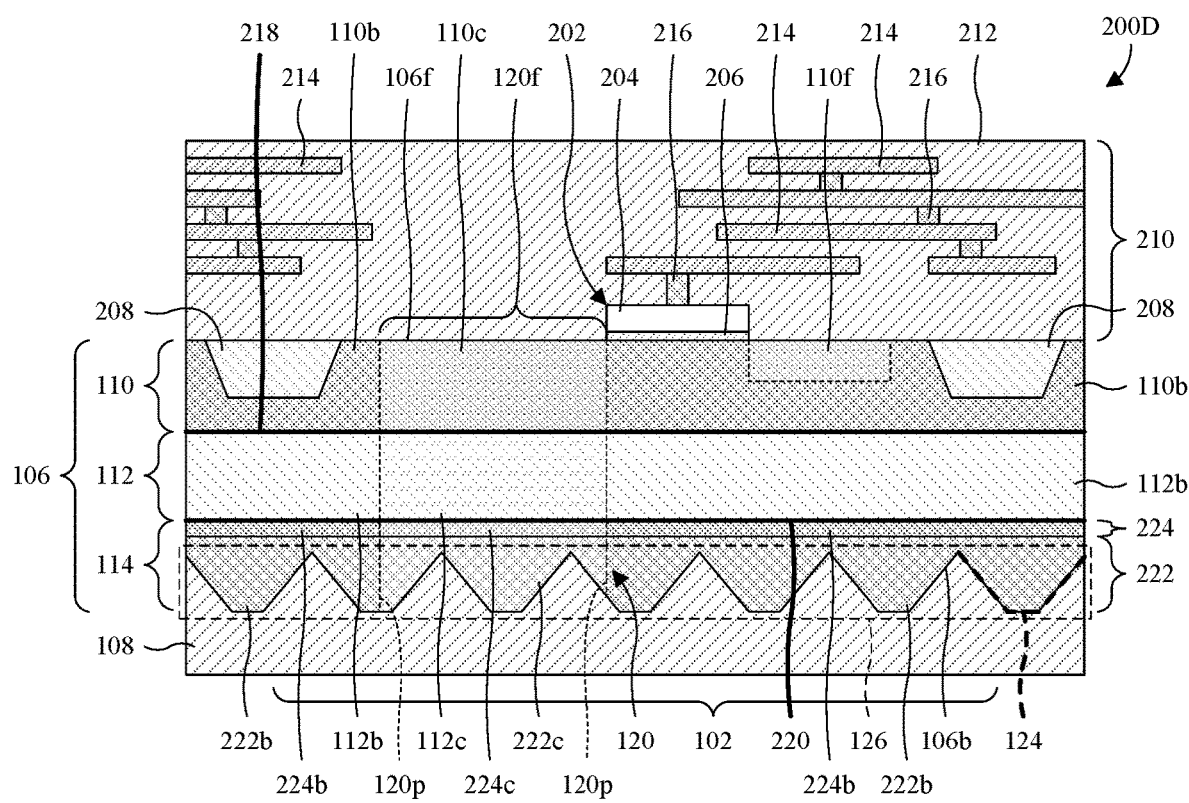

With reference to FIG. 2D, a cross-sectional view 200D of some other more detailed embodiments of the image sensor of FIG. 1 is provided. As illustrated, FIG. 2D is a variant of FIG. 2A in which the back-side semiconductor layer 114 comprises the porous semiconductor layer 222 and the crystalline semiconductor layer 224, and in which the front-side buffer layer 218 and the back-side buffer layer 220 separate the absorption enhancement semiconductor layer 112 respectively from the front-side semiconductor layer 110 and the back-side semiconductor layer 114. The porous semiconductor layer 222 and the crystalline semiconductor layer 224 may, for example, be as described with regard to FIG. 2C, and the front-side buffer layer 218 and the back-side buffer layer 220 may, for example, be as described with regard to FIG. 2B.

Figure 3:
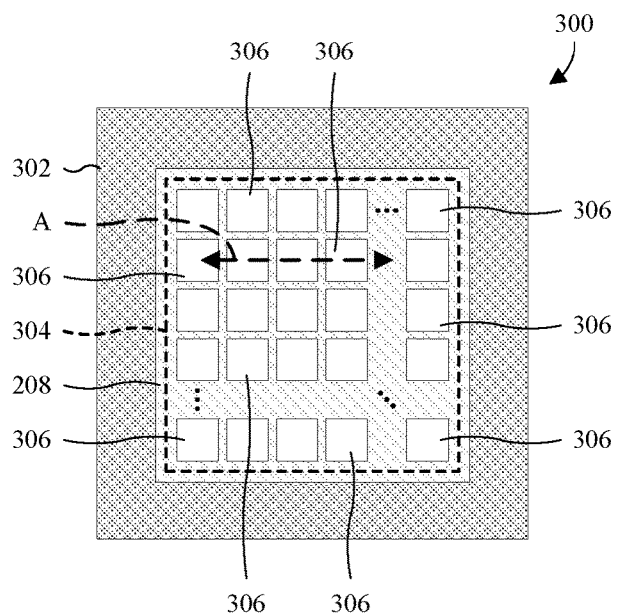
FIG. 3 illustrates a top layout view of some embodiments of the image sensor of FIGS. 1 and 2A-2D.

With reference to FIG. 3, a top layout view 300 of some embodiments of the image sensor of FIGS. 1 and 2A-2D is provided. As illustrated, a logic region 302 laterally surrounds a pixel sensor array 304. The logic region 302 comprises, for example, logic and/or memory devices (not shown) configured to read and/or store data generated by the pixel sensor array 304 in response to incident radiation.

The pixel sensor array 304 is made up of a plurality of absorption enhanced pixel sensors 306 arranged in X rows and Y columns. For ease of illustration, only some of the absorption enhanced pixel sensors 306 are labeled 306. X and Y are integer values greater than zero and may be, for example, the same or different. For example, X and Y may both be 128, 256, 512, 1024, 2048, or 4096. As another example, X and Y may respectively be 768 and 1024, 1024 and 2048, 256 and 1024, 512 and 128, or 4096 and 1024. The absorption enhanced pixel sensors 306 are each individually configured as the absorption enhanced pixel sensor 102 is configured in any one of the FIGS. 1 and 2A-2D.

An isolation structure 208 laterally surrounds the pixel sensor array 304 to electrically isolate the pixel sensor array 304 from the logic region 302. Further, the isolation structure 208 laterally surrounds each of the absorption enhanced pixel sensors 306 to electrically isolate the absorption enhanced pixel sensors 306 from each other.

Figure 4A:
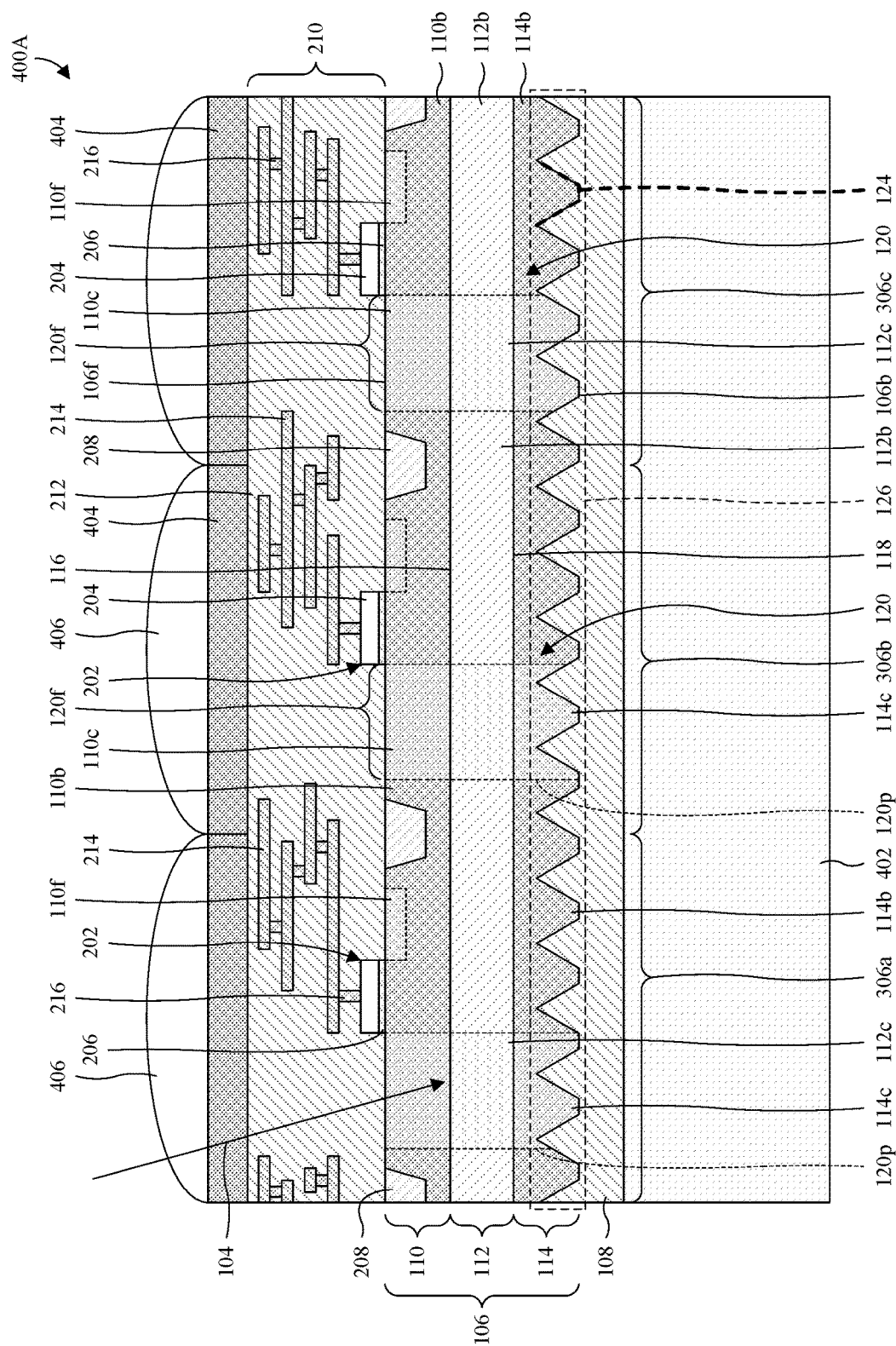
FIGS. 4A and 4B illustrate cross-sectional views of various embodiments of the image sensor of FIG. 3.
Figure 4B:
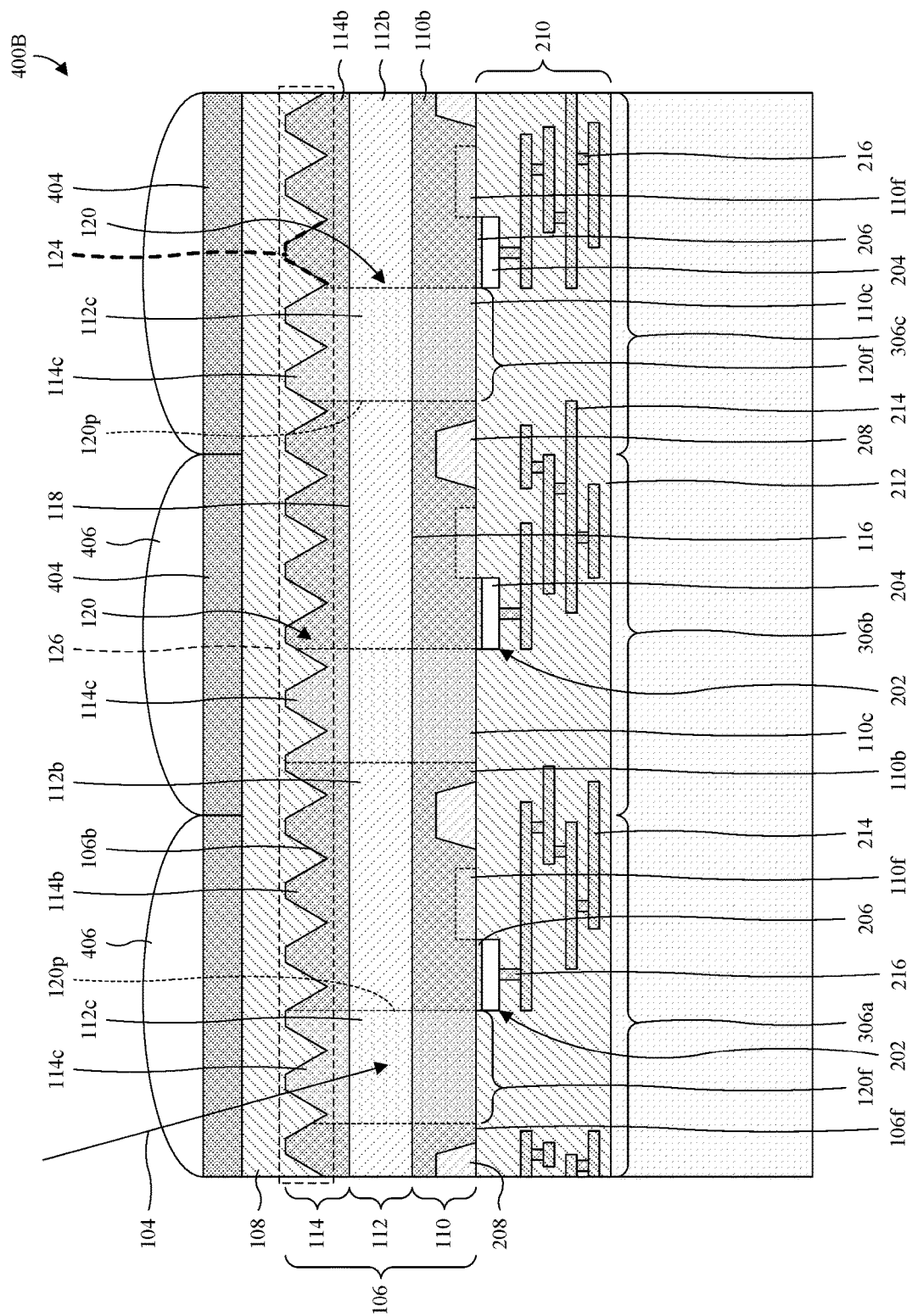

With reference to FIGS. 4A and 4B, cross-sectional views 400A, 400B of various embodiments of the image sensor of FIG. 3 are provided. The cross-sectional views 400A, 400B may, for example, be taken along line A in FIG. 3.

As illustrated by the cross-sectional view 400A of FIG. 4A, the image sensor is FSI, and comprises a plurality of absorption enhanced pixel sensors 306a-306c. The absorption enhanced pixel sensors 306a-306c are individually configured according the absorption enhanced pixel sensor 102 of FIG. 2A, but may alternatively be individually configured according to the absorption enhanced pixel sensor 102 of any one of FIGS. 1 and 2B-2D. Further, the absorption enhanced pixel sensors 306a-306c are covered by the interconnect structure 210, and are each configured to receive incident radiation 104 through the front-side surface 106f and the interconnect structure 210. In some embodiments, the wires 214 of the interconnect structure 210 and the vias 216 of the interconnect structure 210 are limited to sides of the photodetectors 120 of the absorption enhanced pixel sensors 306a-306c (i.e., are not directly over the photodetectors 120) so radiation is not blocked from impinging on the photodetectors 120. For ease of illustrated, only some of the wires 214 are labeled 214, only some of the vias 216 are labeled 216, and only some of the photodetectors 120 are labeled 120.

In some embodiments, a carrier substrate 402 underlies and is bonded to the passivation layer 108. The carrier substrate 402 may be, for example, a bulk silicon substrate, some other bulk semiconductor substrate, or some other substrate. In some embodiments, color filters 404 respectively cover the absorption enhanced pixel sensors 306a-306c. The color filters 404 are configured to pass assigned wavelengths of radiation, while blocking unassigned wavelengths of radiation. For example, a color filter may be configured to pass red wavelengths of radiation, while blocking blue wavelengths of radiation, whereas another color filter may be configured to pass blue wavelengths of radiation, while blocking red wavelengths of radiation. In some embodiments, the color filters 404 are respectively covered by micro-lenses 406 configured to focus incident radiation on the photodetectors 120 of the absorption enhanced pixel sensors 306a-306c, respectively. For ease of illustration, only some of the color filters 404 are labeled 404, and only some of the micro-lenses 406 are labeled 406.

As illustrated by the cross-sectional view 400B of FIG. 4B, a variant of FIG. 4A is provided in which the image sensor is BSI. In contrast with FIG. 4A, the absorption enhanced pixel sensors 306a-306c overlie the interconnect structure 210. Further, the absorption enhanced pixel sensors 306a-306c are each configured to receive incident radiation 104 through the back-side surface 106b and the passivation layer 108. As with FIG. 2A, the absorption enhanced pixel sensors 306a-306c are individually configured according the absorption enhanced pixel sensor 102 of FIG. 2A, but may alternatively be individually configured according to the absorption enhanced pixel sensor 102 of any one of FIGS. 1 and 2B-2D.

With reference to FIGS. 5-12, a series of cross-sectional views 500-1200 of some embodiments of a method for forming a FSI image sensor with absorption enhanced pixel sensors is provided. For example, the method may be employed to form the image sensor of FIG. 4A. As noted above, the image sensor of FIG. 4A is illustrated with regard to the embodiments of FIG. 2A, but may alternatively be employed with the embodiments of any one of FIGS. 1 and 2B-2D. Therefore, it is to be understood that the method may also be employed with the embodiments of any one of FIGS. 1 and 2B-2D.

Figure 5:
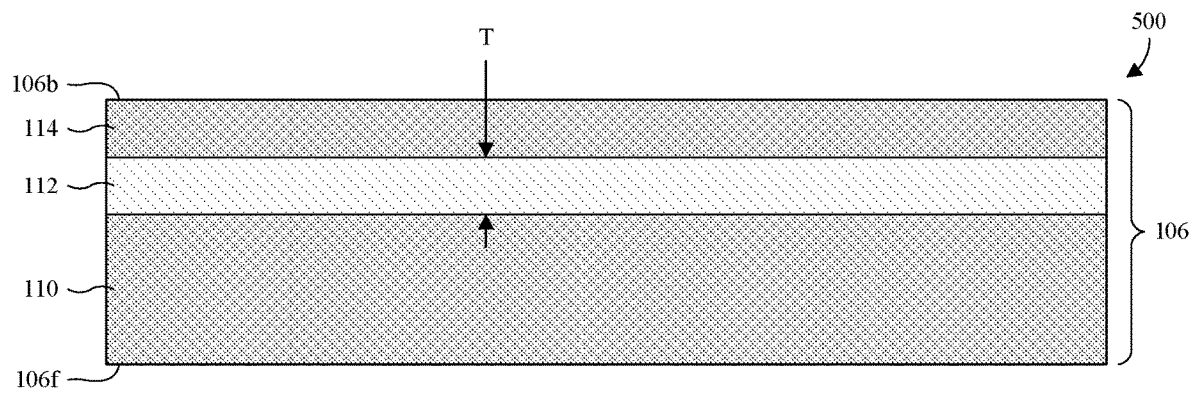
FIGS. 5-12 illustrate a series of cross-sectional views of some embodiments of a method for forming a front-side illuminated (FSI) image sensor with an absorption enhancement semiconductor layer.

As illustrated by the cross-sectional view 500 of FIG. 5, a front-side semiconductor layer 110 is provided. In some embodiments, the front-side semiconductor layer 110 is a bulk silicon substrate, a bulk semiconductor substrate, or some other semiconductor substrate. In some embodiments, the front-side semiconductor layer 110 is or comprises monocrystalline silicon, some other silicon, or some other semiconductor material. In some embodiments, the front-side semiconductor layer 110 has a single material. In some embodiments, the front-side semiconductor layer 110 has an n-type or p-type doping. In some embodiments, the front-side semiconductor layer 110 has a single doping type.

Also illustrated by the cross-sectional view 500 of FIG. 5, an absorption enhancement semiconductor layer 112 is formed covering a front-side semiconductor layer 110. The absorption enhancement semiconductor layer 112 has a low energy bandgap. In some embodiments, the low energy bandgap is an energy bandgap that is less than about 1.00 eV, 0.80 eV, 0.60 eV, 0.66 eV, or 0.40 eV. Further, in some embodiments, the low energy bandgap is an energy bandgap that is less than that of the front-side semiconductor layer 110. In some embodiments, the absorption enhancement semiconductor layer 112 also has a direct energy bandgap. As a result of the low energy bandgap and/or the direct energy bandgap, the absorption enhancement semiconductor layer 112 has a high absorption coefficient, which enhances the QE of photodetectors hereafter formed. In some embodiments, the absorption enhancement semiconductor layer 112 has an n-type or p-type doping. In some embodiments, the absorption enhancement semiconductor layer 112 has the same doping type as the front-side semiconductor layer 110, and/or has a single doping type. The absorption enhancement semiconductor layer 112 may be or comprise, for example, germanium, silicon germanium, crystalline silicon doped with a chalcogen, some other semiconductor material with the low energy bandgap, or any combination of the foregoing. The chalcogen may be or comprise, for example, sulfur (e.g., S), selenium (e.g., Se), tellurium (e.g., Te), some other chalcogen, or any combination of the foregoing.

In some embodiments, the absorption enhancement semiconductor layer 112 is formed by doping a bulk semiconductor substrate with the chalcogen. In such embodiments, the absorption enhancement semiconductor layer 112 is a chalcogen doped region of the bulk semiconductor substrate, and the front-side semiconductor layer 110 is a remainder of the bulk semiconductor substrate. The doping may, for example, be performed by ion implantation or some other doping process. Further, in some embodiments where the absorption enhancement semiconductor layer 112 is doped with the chalcogen, the absorption enhancement semiconductor layer 112 is doped in excess of the solubility limit (i.e., is supersaturated) to facilitate sub-band gap absorption of photons. The supersaturation may, for example, be performed by ion implantation followed by pulsed laser melting (e.g., about 1-7, 2-6, 3-5, or 4 laser shots).

In other embodiments, the absorption enhancement semiconductor layer 112 is formed by epitaxy. The epitaxy may, for example, be performed by chemical vapor deposition (CVD), physical vapor deposition (PVD), some other deposition process, molecular beam epitaxy, or some other epitaxial process. In some of the epitaxial embodiments, the absorption enhancement semiconductor layer 112 is or comprises silicon germanium or germanium. Alternatingly, in some of the epitaxial embodiments, the absorption enhancement semiconductor layer 112 is or comprises crystalline silicon doped with the chalcogen. The doping may, for example, be performed by ion implantation or some other doping process. Further, in some of the epitaxial embodiments, the absorption enhancement semiconductor layer 112 is supersaturated with the chalcogen as described above.

Also illustrated by the cross-sectional view 500 of FIG. 5, a back-side semiconductor layer 114 is formed covering the absorption enhancement semiconductor layer 112. In some embodiments, the back-side semiconductor layer 114 has an n-type or p-type doping. In some embodiments, the back-side semiconductor layer 114 has a single doping type. In some embodiments, the back-side semiconductor layer 114 has the same doping type as the front-side semiconductor layer 110 and/or the absorption enhancement semiconductor layer 112. In some embodiments, the back-side semiconductor layer 114 has a higher energy bandgap than the absorption enhancement semiconductor layer 112. The back-side semiconductor layer 114 may be, for example, monocrystalline silicon, porous silicon, some other semiconductor material, the same semiconductor material as the front-side semiconductor layer 110, or any combination of the foregoing. In some embodiments, the back-side semiconductor layer 114 is a single material. The back-side semiconductor layer 114 may, for example, be formed by CVD, PVD, some other deposition process, molecular beam epitaxy, or some other epitaxial process.

In some embodiments, a thickness T of the absorption enhancement semiconductor layer 112 is controlled so the back-side semiconductor layer 114 has the same crystalline direction as the front-side semiconductor layer 110. For example, if the thickness T of the absorption enhancement semiconductor layer 112 is large, the back-side semiconductor layer 114 may have a different crystalline direction than the front-side semiconductor layer 110. Additionally, in some embodiments in which the absorption enhancement semiconductor layer 112 is or comprises silicon germanium, a concentration of germanium in the absorption enhancement semiconductor layer 112 is controlled so the back-side semiconductor layer 114 has the same crystalline direction as the front-side semiconductor layer 110. In some embodiments, the absorption enhancement semiconductor layer 112 is or comprises $Si_{0.8}Ge_{0.2}$ and has a thickness T between about 1000-3000 angstroms, about 900-1100 angstroms, or about 500-1500 angstroms so the back-side semiconductor layer 114 has the same crystalline direction as the front-side semiconductor layer 110.

The back-side semiconductor layer 114, the absorption enhancement semiconductor layer 112, and the front-side semiconductor layer 110 define a composite substrate 106. The front-side semiconductor layer 110 is along and defines a front-side surface 106f of the composite substrate 106, and the back-side semiconductor layer 114 is along and defines a back-side surface 106b of the composite substrate 106. The back-side surface 106b and the front-side surface 106f are on opposite sides of the composite substrate 106.

Figure 6:
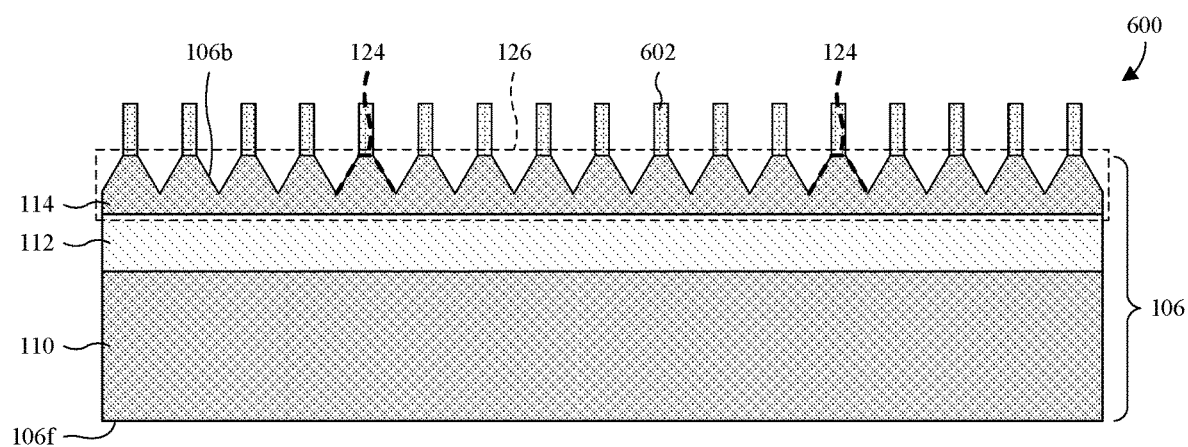

As illustrated by the cross-sectional view 600 of FIG. 6, a plurality of protrusions 124 is formed in the composite substrate 106, including the back-side semiconductor layer 114. For ease of illustration, only some of the protrusions 124 are labeled 124. The protrusions 124 at least partially define an absorption enhancement structure 126, and prevent incident radiation from reflecting away the composite substrate 106. For example, the protrusions 124 may have angled sidewalls to prevent such reflectance. As a result, the protrusions 124 enhance the sensitivity of photodetectors hereafter formed in composite substrate 106. In some embodiments, the protrusions 124 are in a periodic pattern or array. In some embodiments, the protrusions 124 each have a cone shape, a pyramid shape, or some other shape. In some embodiments, the protrusions 124 define a sawtoothed profile.

In some embodiments, a process for forming the protrusions 124 comprises dry etching the back-side semiconductor layer 114. For example, a photoresist layer 602 may be formed on the back-side semiconductor layer 114, and patterned with a pattern of the protrusions 124. A dry etchant may then be applied to the back-side semiconductor layer 114 with the photoresist layer 602 in place to form the protrusions 124, and the photoresist layer 602 may be subsequently stripped. In some embodiments, the dry etchant damages the back-side semiconductor layer 114, thereby resulting in electron traps along the back-side surface 106b of a composite substrate 106. The electron traps may, in turn, lead to leakage current, dark current, and white pixels. Therefore, in some embodiments, the process for forming the protrusions 124 further comprises wet etching the back-side semiconductor layer 114 to remove the damage. For example, a wet etchant may be applied to the back-side semiconductor layer 114 before or after the photoresist layer 602 is stripped. The wet etchant may be, for example, tetramethylammonium hydroxide (TMAH) or some other wet etchant.

In some embodiments, a systematic structure of pores is formed in the back-side semiconductor layer 114. The pores may be, for example, micrometer sized pores, nanometer sized pores, smaller sized pores, or any combination of the foregoing. The pores serve as a light trap for the incident radiation, thereby enhancing QE of photodetectors hereafter formed. Further, in some embodiments, the combination of the systematic structure of pores and the protrusions 124 results in the absorption enhancement structure 126 having a direct energy bandgap, which also enhances QE of the photodetectors In some embodiments, a process for forming the systematic structure of pores comprises performing an etch into the back-side semiconductor layer 114. The etch may, for example, be performed by applying a solution of hydrofluoric acid to the back-side semiconductor layer 114, and subsequently activating the hydrofluoric acid. The hydrofluoric acid may, for example, be activated: electrochemically by applying a sufficient voltage to the solution (anodic etching); electrochemically by adding an oxidant with a sufficient standard electrode potential to the solution (stain etching); or photoelectrochemically by irradiating the solution with a laser or lamp with a sufficiently short wavelength to excite electrons in the solution to the conduction band. In some embodiments, the solution further includes a ferric nitride. The process for forming the systematic structure of pores may be formed before, during, or after the process for forming the protrusions 124.

Figure 7:
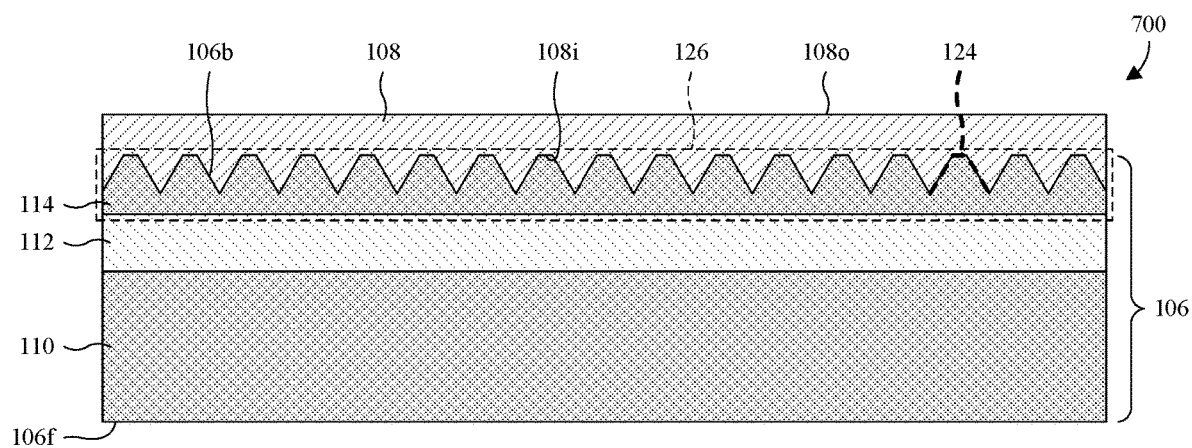

As illustrated by cross-sectional view 700 of FIG. 7, a passivation layer 108 is formed covering the back-side surface 106b of the composite substrate 106. The passivation layer 108 has an inner surface 108i facing the back-side surface 106b of the composite substrate 106, and further has an outer surface 108o opposite the inner surface 108i. In some embodiments, the inner surface 108i of the passivation layer 108 is conforms and/or directly contacts the back-side surface 106b of the composite substrate 106. In some embodiments, the outer surface 108o of the passivation layer 108 is substantially flat and/or substantially planar. The passivation layer 108 may be or comprise, for example, silicon dioxide, silicon nitride, a high κ dielectric, some other dielectric, or any combination of the foregoing.

In some embodiments, a process for forming the passivation layer 108 comprises depositing the passivation layer 108 on the back-side surface 106b of the composite substrate 106, and subsequently performing a planarization into the outer surface 108o of the passivation layer 108. The depositing may, for example, be performed by thermal oxidation, CVD, PVD, sputtering, or some other deposition process. The planarization may, for example, be performed by a chemical mechanical polish (CMP) or some other planarization process.

Figure 8:
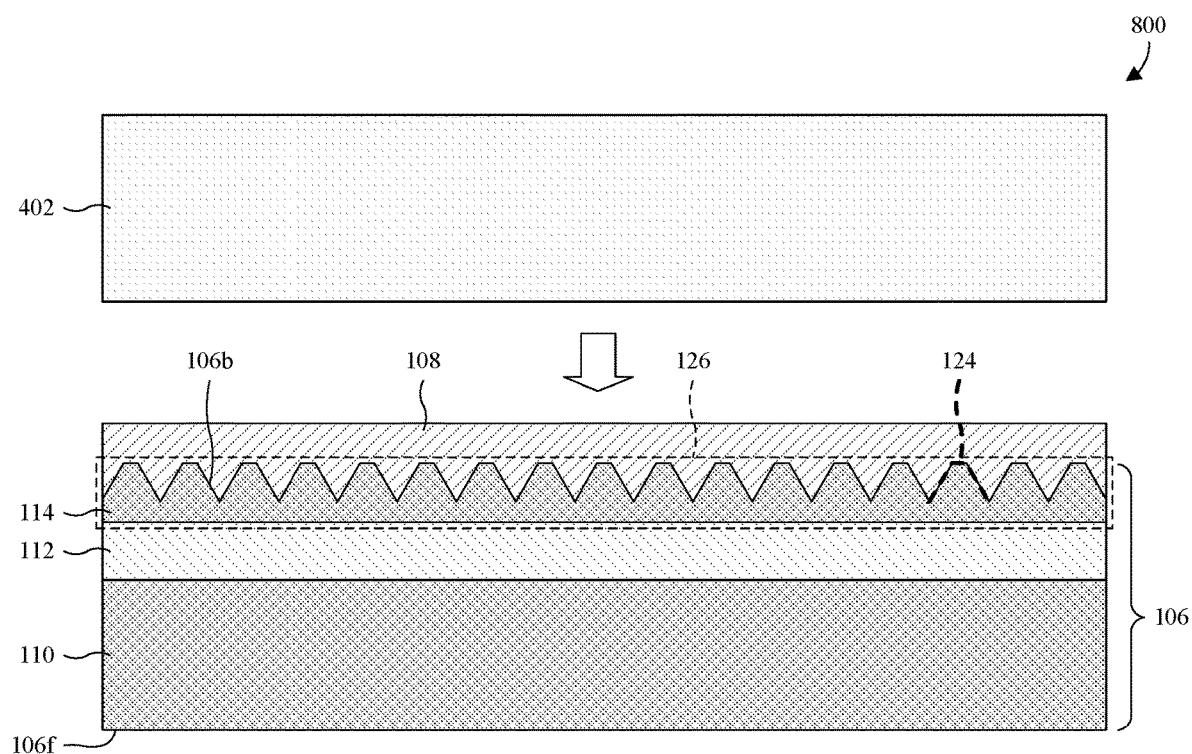

As illustrated by the cross-sectional view 800 of FIG. 8, in some embodiments, the back-side surface 106b of the composite substrate 106 is bonded to a carrier substrate 402 through the passivation layer 108. The carrier substrate 402 may be, for example, a bulk monocrystalline silicon substrate, some other silicon substrate, a SOI substrate, some other semiconductor substrate, or some other substrate. In some embodiments, the bonding process is performed by a fusion bonding process or some other bonding process.

Figure 9:
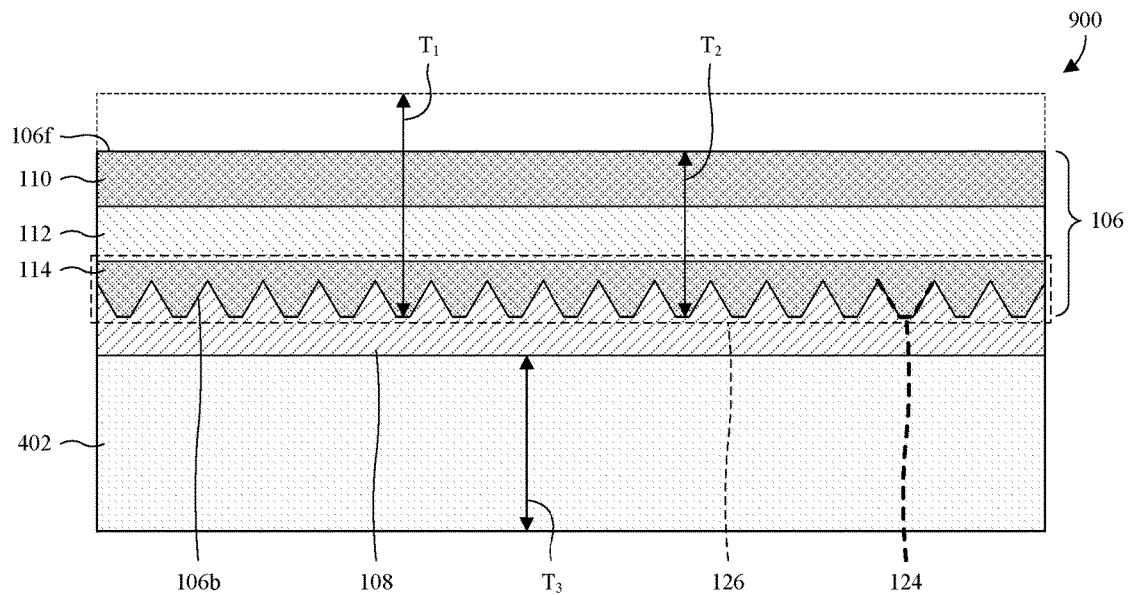

As illustrated by the cross-sectional view 900 of FIG. 9, the structure of FIG. 8 is flipped vertically. Further, the composite substrate 106 is thinned at the front-side surface 106f of the composite substrate 106, thereby reducing a thickness of the composite substrate 106 and a thickness of the front-side semiconductor layer 110. The thinning reduces a thickness of the composite substrate 106 from a first thickness $T_1$ to a second thickness $T_2$. The second thickness $T_2$ may, for example, be less than a third thickness $T_3$ of the carrier substrate 402. In some embodiments, the composite substrate 106 is thinned by performing an etch and/or a planarization into the front-side semiconductor layer 110. The planarization may, for example, be performed by a CMP or some other planarization process.

Figure 10:
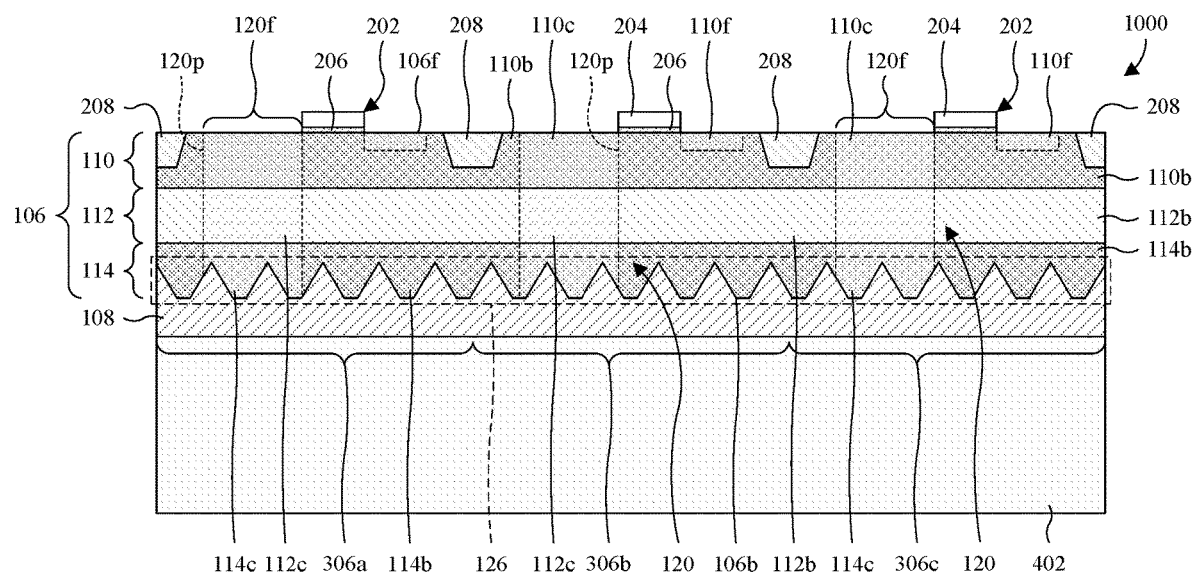

As illustrated by the cross-sectional view 1000 of FIG. 10, a plurality of absorption enhanced pixel sensors 306a-306c are formed on the front-side surface 106f of the composite substrate 106. Each of the absorption enhanced pixel sensors 306a-306c comprises a photodetector 120 defined by the front-side semiconductor layer 110, the absorption enhancement semiconductor layer 112, and the back-side semiconductor layer 114. For ease of illustration, only some of the photodetectors 120 are labeled 120. Each photodetector 120 of the absorption enhanced pixel sensors 306a-306c comprises a first semiconductor region 120f, a second semiconductor region (not labeled), and a photo junction 120p. For ease of illustration, only some of the first semiconductor regions 120f are labeled 120f, and only some of the photo junctions 120p are labeled 120p. The first semiconductor region 120f has a first doping type, and the second semiconductor region has a second doping type opposite the first doping type. The first semiconductor region 120f is surrounded by the second semiconductor region, and the first semiconductor region 120f and the second semiconductor region partially or wholly define the photo junction 120p. The photo junction 120p may be, for example, a PN junction, a PIN junction, or some other photo junction.

In some embodiments, each first semiconductor region 120f of the absorption enhanced pixel sensors 306a-306c is defined wholly or partially by a front-side CCR 110c of the front-side semiconductor layer 110, an absorption enhancement CCR 112c of the absorption enhancement semiconductor layer 112, and a back-side CCR 114c of the back-side semiconductor layer 114. For ease of illustration, only some of the front-side CCRs 110c are labeled 110c, only some of the absorption enhancement CCRs 112c are labeled 112c, and only some of the back-side CCRs 114c are labeled 114c. In some embodiments, the second semiconductor regions of the of the absorption enhanced pixel sensors 306a-306c are defined wholly or partially by a front-side bulk region 110b of the front-side semiconductor layer 110, an absorption enhancement bulk region 112b of the absorption enhancement semiconductor layer 112, and a back-side bulk region 114b of the back-side semiconductor layer 114.

In some embodiments, a process for forming the photodetectors 120 comprises implanting dopants into the composite substrate 106 to form the first semiconductor regions 120f. In some of such embodiments, the composite substrate 106 initially has a single doping type, such that the doping is performed using dopants of an opposite doping type. The doping may, for example, be performed using ion implantation or some other doping process, and/or may, for example, use a photoresist mask to selectively implant the dopants.

Each of the absorption enhanced pixel sensors 306a-306c further comprises a transfer transistor 202. For ease of illustration, only some of the transfer transistors 202 are labeled 202. Each transfer transistor 202 of the absorption enhanced pixel sensors 306a-306c comprises a gate electrode 204, a gate dielectric layer 206, a first source/drain region (not labeled), and a second source/drain region (not labeled). For ease of illustration, only some of the gate electrodes 204 are labeled 204, and only some of the gate dielectric layers 206 are labeled 206. The gate dielectric layer 206 overlies the front-side semiconductor layer 110, and the gate electrode 204 overlies the gate dielectric layer 206. The first and second source/drain regions are at least partially defined by the front-side semiconductor layer 110 and have the same doping type, which is opposite that of the front-side bulk region 110b. Further, the first and second source/drain regions are respectively on opposite sides of the gate electrode 204, such that the gate electrode 204 is sandwiched between the first and second source/drain regions. The first source/drain region may be defined by, for example, a respective one of the first semiconductor regions 120f of the photodetectors 120. The second source/drain region may be defined by, for example, a floating diffusion region (FDR) 110*f* of the front-side semiconductor layer 110.

In some embodiments, a process for forming the transfer transistors 202 is performed before forming the photodetectors 120. In other embodiments, the process for forming the transfer transistors 202 is performed while forming the photodetectors 120. Further, in some embodiments, the process for forming the transfer transistors 202 comprises forming a dielectric layer and an electrode layer stacked on the front-side semiconductor layer 110. The dielectric layer may be formed by, for example, thermal oxidation, PVD, CVD, sputtering, some other deposition process, or any combination of the foregoing. The electrode layer may be formed by, for example, electrochemical plating, electroless plating, PVD, CVD, sputtering, some other deposition or plating process, or any combination of the foregoing. Further, in some embodiments, the process for forming the transfer transistors 202 comprises performing an etch into the dielectric layer and the electrode layer to define the gate electrodes 204 and the gate dielectric layers 206, and subsequently implanting dopants into the front-side semiconductor layer 110 to define the first and second source/drain regions.

Also illustrated by the cross-sectional view 1000 of FIG. 10, an isolation structure 208 is formed extending into the front-side semiconductor layer 110 to separate and surround the absorption enhanced pixel sensors 306*a*-306*c*. In some embodiments, the isolation structure 208 is formed prior to forming the absorption enhanced pixel sensors 306*a*-306*c*. The isolation structure 208 may, for example, be formed as an STI structure, a DTI structure, an implant isolation region, or some other isolation structure. In some embodiments, the process for forming the isolation structure 208 comprises etching the front-side semiconductor layer 110 to form trenches, and subsequently filling the trenches with a dielectric material.

Figure 11:
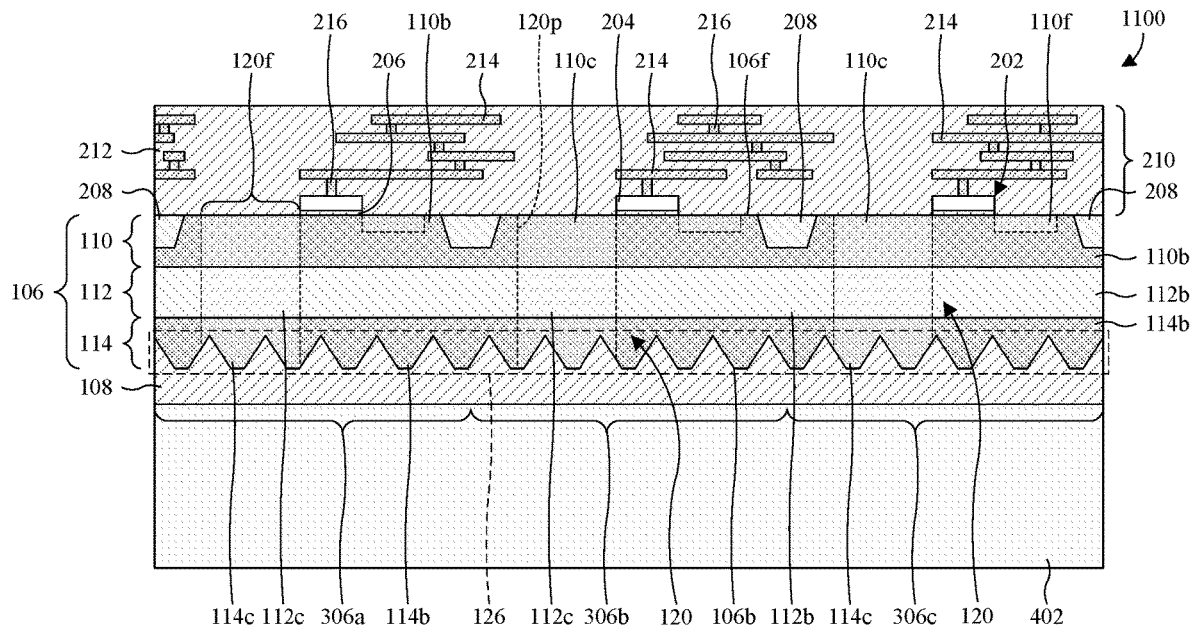

As illustrated by the cross-sectional view 1100 of FIG. 11, an interconnect structure 210 is formed covering the the absorption enhanced pixel sensors 306*a*-306*c* and the composite substrate 106. The interconnect structure 210 comprises an ILD layer 212, a plurality of wires 214, and a plurality of vias 216. For ease of illustration, only some of the wires 214 are labeled 214, and only some of the vias 216 are labeled 216. The wires 214 are alternatingly stacked with the vias 216 in the ILD layer 212 to define conductive paths electrically coupling the absorption enhanced pixel sensors 306*a*-306*c* to each other and/or other devices.

In some embodiments, a process for forming the interconnect structure 210 comprises repeatedly forming an ILD sublayer (i.e., a sublayer of the ILD layer 212) over the composite substrate 106, performing a planarization into a top surface of the ILD sublayer, selectively etching the ILD sublayer to form a via opening and/or a wire opening, and filling the via opening and/or the wire opening with a conductive material. The ILD sublayer may, for example, be formed by thermal oxidation, CVD, PVD, sputtering, some other deposition process, or any combination of the foregoing. The planarization may, for example, be performed by a CMP or some other planarization process. The selective etching may, for example, be performed "selectively" using photolithography. The filling may, for example, be performed by CVD, PVD, electroplating, electro-less plating, some other deposition or plating process, or any combination of the foregoing. In some embodiments, the process for forming the interconnect structure 210 comprises repeatedly performing a dual-damascene process or a single-damascene process to form the wires 214 and the vias 216. The dual-damascene process forms two conductive features (e.g., a wire and a via) at the same time, whereas the single-damascene process forms a single conductive feature (e.g., a wire or a via) at a time.

Figure 12:
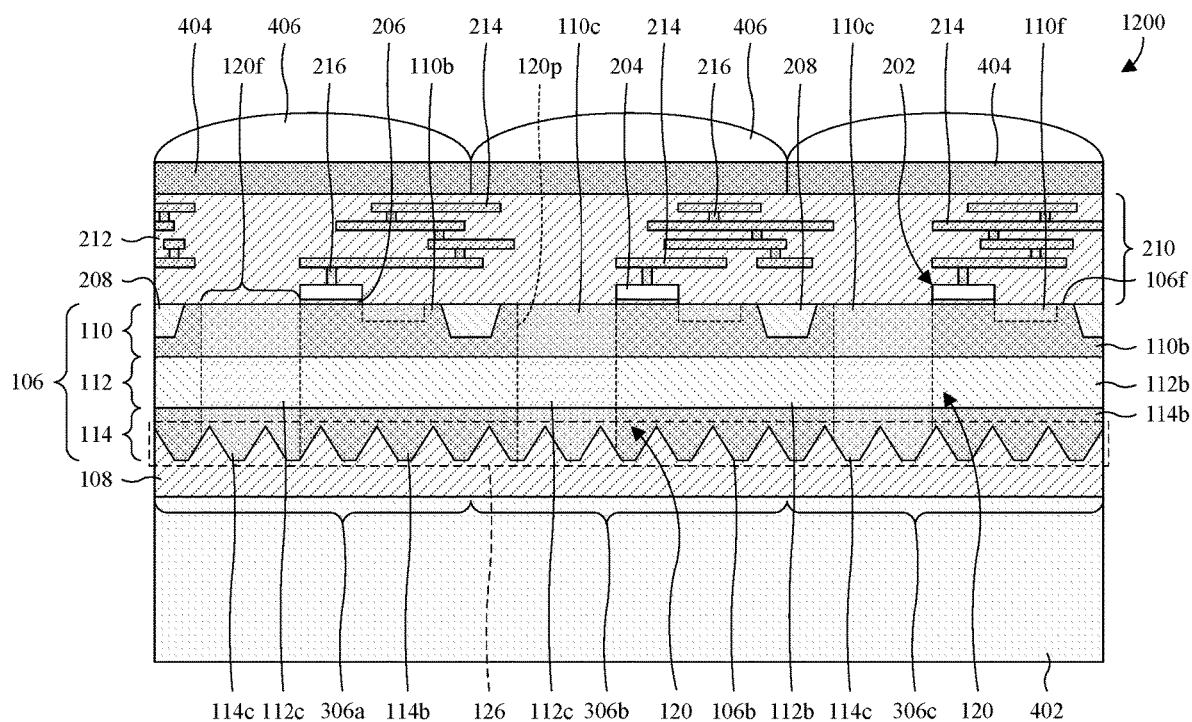

As illustrated by the cross-sectional view 1200 of FIG. 12, a plurality of color filters 404 is formed on the interconnect structure 210. For ease of illustration, only some of the color filters 404 are labeled 404. The color filters 404 respectively overlie the absorption enhanced pixel sensors 306*a*-306*c*, and each passes assigned wavelengths of radiation while blocking unassigned wavelengths of radiation. In some embodiments, the color filters 404 are formed by forming a color filter layer for first wavelengths of radiation, patterning the color filter layer, and then repeating the foregoing for different wavelengths of radiation.

Also illustrated by the cross-sectional view 1200 of FIG. 12, a plurality of micro-lenses 406 is formed on the color filters 404. For ease of illustration, only some of the micro-lenses 406 are labeled 406. The micro-lenses 406 respectively overlie the color filters 404, and focus incident radiation respectively on the absorption enhanced pixel sensors 306*a*-306*c*. In some embodiments, a process for forming the micro-lenses 406 comprises forming a micro-lens layer over the color filters 404, and subsequently patterning the micro-lens layer into micro-lens templates individual to the micro-lenses 406.

While not illustrated, an additional absorption enhancement semiconductor layer may be formed conforming to the protrusions 124, between the passivation layer 108 and the back-side semiconductor layer, in other embodiments. The additional absorption enhancement semiconductor layer may, for example, be as the absorption enhancement semiconductor layer 112 is described with regard to FIG. 5, and/or may, for example, be formed as the absorption enhancement semiconductor layer 112 is described with regard to FIG. 5. A challenge with these other embodiments is that other devices on the composite substrate 106 (see, e.g., the logic region 302 of FIG. 3) may limit temperatures used while forming the additional absorption enhancement semiconductor layer. Exceeding the temperature limit may damage the other devices. As a result of the temperature limit, the additional absorption enhancement semiconductor layer may have a poor crystalline quality and/or dopants that are not fully activated, which may lead to leakage current, dark current, and white pixels. Note that since the absorption enhancement semiconductor layer 112 is formed early in the method, the absorption enhancement semiconductor layer 112 is not subject to the temperature limit.

Figure 13:
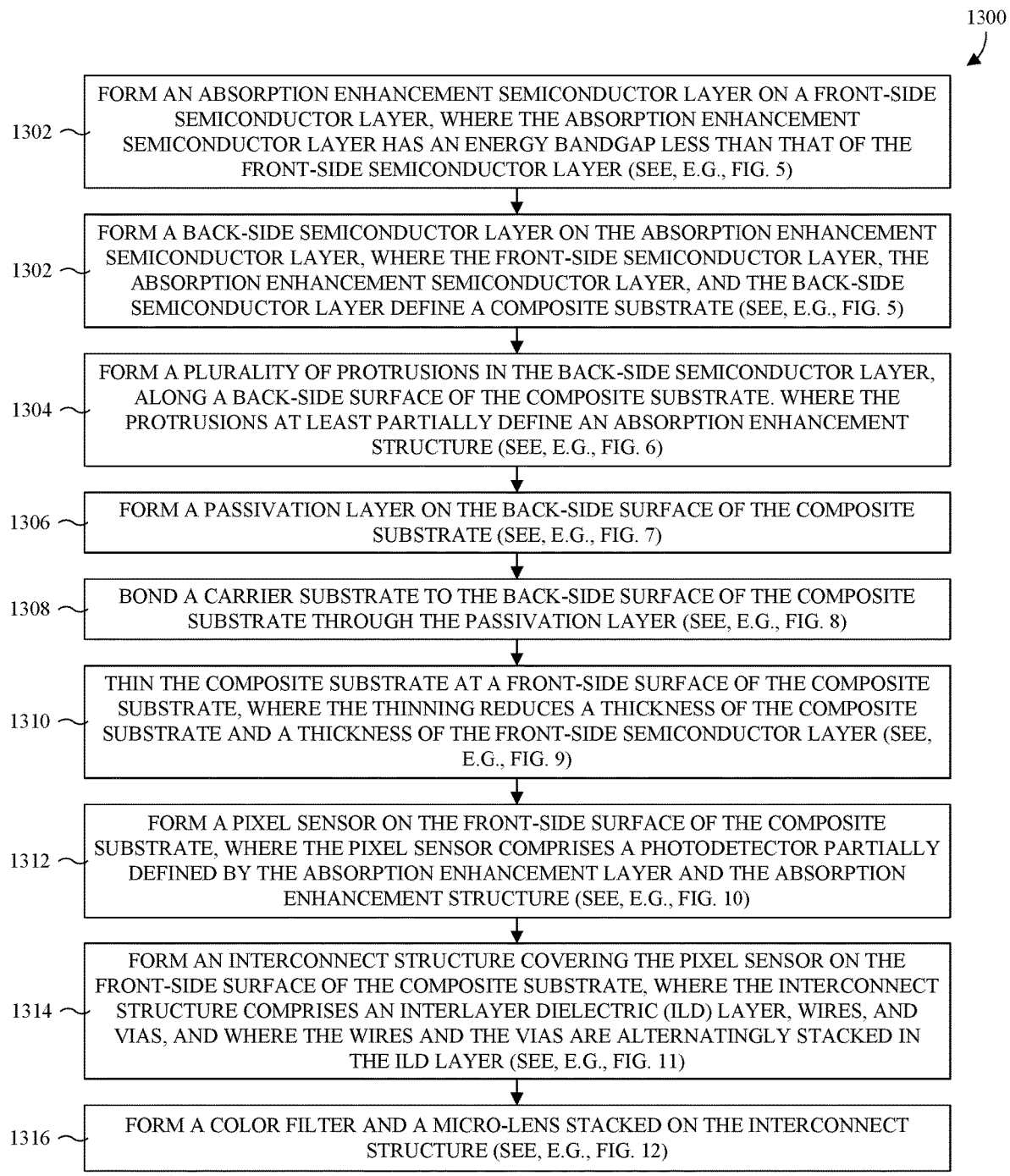
FIG. 13 illustrates a flowchart of some embodiments of the method of FIGS. 5-12.

With reference to FIG. 13, a flowchart 1300 of some embodiments of the method of FIGS. 5-12 is provided.

At 1302, an absorption enhancement semiconductor layer is formed on a front-side semiconductor layer. The absorption enhancement semiconductor layer has an energy bandgap less than that of the front-side semiconductor layer. See, for example, FIG. 5. The high absorption layer may be, for example, germanium, silicon germanium, or monocrystalline silicon dope with a chalcogen. Further, the high absorption layer may, for example, have a direct energy bandgap or an indirect energy bandgap.

Also at 1302, a back-side semiconductor layer is formed on the absorption enhancement semiconductor layer. The front-side semiconductor layer, the absorption enhancement semiconductor layer, and the back-side semiconductor layer collectively define a composite substrate. See, for example, FIG. 5.

At 1304, a plurality of protrusions is formed in the back-side semiconductor layer, along a back-side surface of the composite substrate. The protrusions at least partially define an absorption enhancement structure. See, for example, FIG. 6.

At 1306, a passivation layer is formed on the back-side surface of the composite substrate. See, for example, FIG. 7.

At 1308, a carrier substrate is bonded to the back-side surface of the composite substrate through the passivation layer. See, for example, FIG. 8.

At 1310, the composite substrate is thinned at a front-side surface of the composite substrate, thereby reducing a thickness of the composite substrate and a thickness of the front-side semiconductor layer. See, for example, FIG. 9.

At 1312, a pixel sensor is formed on the front-side surface of the composite substrate. The pixel sensor comprises a photodetector partially defined by the absorption enhancement semiconductor layer and the absorption enhancement structure. See, for example, FIG. 10. Because the absorption enhancement semiconductor layer has the low energy bandgap, the absorption enhancement semiconductor has a high absorption coefficient. This, in turn, enhances absorption of incident radiation by photodetector, such that the photodetector has a high QE. The high QE allows the photodetector to be used for high wavelength radiation greater than about 800 nanometers. Further, the high QE allows the photodetector to be used for the high wavelength radiation without a large thickness. As such, costs, die size, crosstalk, or any combination of the foregoing is/are low.

At 1314, an interconnect structure is formed covering the pixel sensor on the front-side surface of the composite substrate. The interconnect structure comprises an ILD layer, wires, and vias, and the wires and the vias are alternatingly stacked in the ILD layer. See, for example, FIG. 11.

At 1316, a color filter and a micro-lens are formed stacked on the interconnect structure. See, for example, FIG. 12.

While the flowchart 1300 of FIG. 13 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 14-21, a series of cross-sectional views 1400-2100 of some embodiments of a method for forming a BSI image sensor with absorption enhanced pixel sensors is provided. For example, the method may be employed to form the image sensor of FIG. 4B. As noted above, the image sensor of FIG. 4B is illustrated with regard to the embodiments of FIG. 2A, but may alternatively be employed with the embodiments of any one of FIGS. 1 and 2B-2D. Therefore, it is to be understood that the method may also be employed with the embodiments of any one of FIGS. 1 and 2B-2D.

Figure 14:
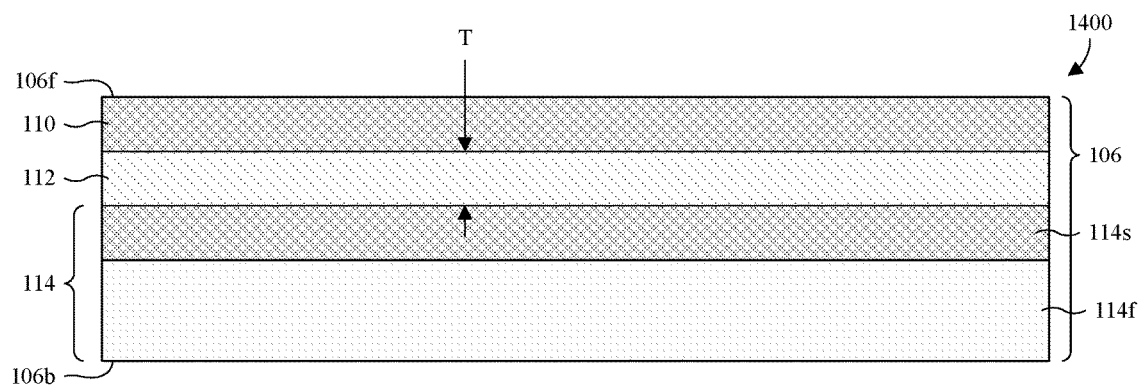
FIGS. 14-21 illustrate a series of cross-sectional views of some embodiments of a method for forming a back-side illuminated (BSI) image sensor with an absorption enhancement semiconductor layer.

As illustrated by the cross-sectional view 1400 of FIG. 14, a back-side semiconductor layer 114 is provided or formed. In some embodiments, the back-side semiconductor layer 114 is or comprises a bulk silicon substrate, some other bulk semiconductor substrate, or some other semiconductor substrate. The back-side semiconductor layer 114 may be or comprise, for example, monocrystalline silicon, nanoporous silicon, some other silicon, some other semiconductor material, or any combination of the foregoing. Further, the back-side semiconductor layer 114 may, for example, have an n-type or p-type doping.

In some embodiments, the back-side semiconductor layer 114 comprises a first back-side semiconductor sublayer 114*f* and a second back-side semiconductor sublayer 114*s* covering the first back-side semiconductor sublayer 114*f*. The first back-side semiconductor sublayer 114*f* may be or comprise, for example, a bulk silicon substrate, a bulk semiconductor substrate, or some other substrate. The first back-side semiconductor sublayer 114*f* and the second back-side semiconductor sublayer 114*s* may be or comprise, for example, monocrystalline silicon, nanoporous silicon, some other semiconductor material, or any combination of the foregoing. Further, the first back-side semiconductor sublayer 114*f* and the second back-side semiconductor sublayer 114*s* may, for example, have an n-type or p-type doping. In some embodiments, the first back-side semiconductor sublayer 114*f* and the second back-side semiconductor sublayer 114*s* are the same semiconductor material and have the same doping type. Further, in some of such embodiments, the first back-side semiconductor sublayer 114*f* has a greater doping concentration than the second back-side semiconductor sublayer 114*s*, or vice versa In some embodiments, the back-side semiconductor layer 114 is formed by providing the first back-side semiconductor sublayer 114*f*, and subsequently depositing the second back-side semiconductor sublayer 114*s* on the first back-side semiconductor sublayer 114*f*. The depositing may, for example, be performed by CVD, PVD, molecular beam epitaxy, or some other deposition process. In other embodiments, the back-side semiconductor sublayer 114 is formed by providing a bulk semiconductor substrate, and subsequently doping the bulk semiconductor substrate. In such embodiments, the second back-side semiconductor sublayer 114*s* is the doped portion of the bulk semiconductor substrate, and the first back-side semiconductor sublayer 114*f* is a remainder of the bulk semiconductor substrate. The doping may, for example, be performed by ion implantation of some other doping process.

Also illustrated by the cross-sectional view 1400 of FIG. 14, an absorption enhancement semiconductor layer 112 is formed covering the back-side semiconductor layer 110. The absorption enhancement semiconductor layer 112 has a low energy bandgap that enhances quantum efficiency of photodetectors hereafter formed. In some embodiments, the low energy bandgap is an energy bandgap that is less than about 1.00 eV, 0.80 eV, 0.60 eV, 0.66 eV, or 0.40 eV. Further, in some embodiments, the low energy bandgap is an energy bandgap that is less than that of the back-side semiconductor layer 114. In some embodiments, the absorption enhancement semiconductor layer 112 also has a direct energy bandgap. The absorption enhancement semiconductor layer 112 may be or comprise, for example, germanium, silicon germanium, crystalline silicon doped with a chalcogen, or some other semiconductor material with the low energy bandgap. Further, the absorption enhancement semiconductor layer 112 may, for example, be as described with regard to FIG. 5.

In some embodiments, the absorption enhancement semiconductor layer 112 is formed by epitaxy. The epitaxy may, for example, be performed by CVD, PVD, some other deposition process, molecular beam epitaxy, or some other epitaxial process. In some embodiments, the absorption enhancement semiconductor layer 112 is doped with the chalcogen by ion implantation or some other doping process. Further, in some embodiments, the absorption enhancement semiconductor layer 112 is supersaturated with the chalcogen. The supersaturation may, for example, be performed by ion implantation, followed by pulsed laser melting (e.g., about 1-7, 2-6, 3-5, or 4 laser shots).

Also illustrated by the cross-sectional view 1400 of FIG. 14, a front-side semiconductor layer 110 is formed covering the absorption enhancement semiconductor layer 112. The front-side semiconductor layer 110 may be or comprise, for example, monocrystalline silicon, some other semiconductor material, or any combination of the foregoing. Further, the front-side semiconductor layer 110 may, for example, be formed by CVD, PVD, some other deposition process, molecular beam epitaxy, or some other epitaxial process.

In some embodiments, a thickness T of the absorption enhancement semiconductor layer 112 is controlled so the front-side semiconductor layer 110 has the same crystalline direction as the back-side semiconductor layer 114. For example, if the thickness T of the absorption enhancement semiconductor layer 112 is large, the front-side semiconductor layer 110 may have a different crystalline direction than the back-side semiconductor layer 114. Additionally, in some embodiments in which the absorption enhancement semiconductor layer 112 is or comprises silicon germanium, a concentration of germanium in the absorption enhancement semiconductor layer 112 is controlled so the front-side semiconductor layer 110 has the same crystalline direction as the back-side semiconductor layer 114. In some embodiments, the absorption enhancement semiconductor layer 112 is or comprises $Si_{0.8}Ge_{0.2}$ and has a thickness T between about 1000-3000 angstroms, about 900-1100 angstroms, or about 500-1500 angstroms so the front-side semiconductor layer 110 has the same crystalline direction as the back-side semiconductor layer 114.

The back-side semiconductor layer 114, the absorption enhancement semiconductor layer 112, and the front-side semiconductor layer 110 define a composite substrate 106. The front-side semiconductor layer 110 is along and defines a front-side surface 106f of the composite substrate 106, and the back-side semiconductor layer 114 is along and defines a back-side surface 106b of the composite substrate 106. The back-side surface 106b and the front-side surface 106f are on opposite sides of the composite substrate 106.

Figure 15:
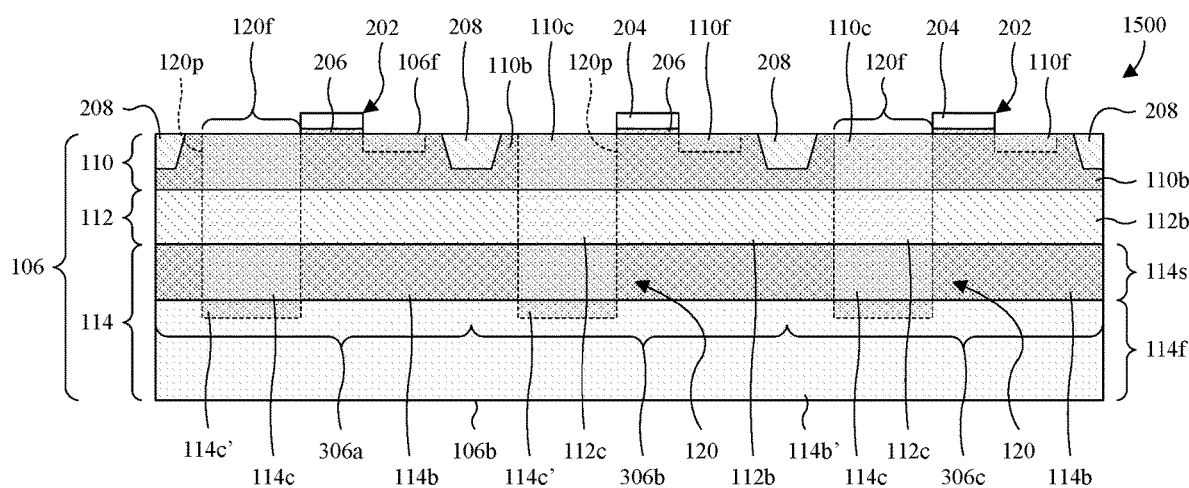

As illustrated by the cross-sectional view 1500 of FIG. 15, a plurality of absorption enhanced pixel sensors 306a-306c are formed on the front-side surface 106f of the composite substrate 106. Each of the absorption enhanced pixel sensors 306a-306c comprises a photodetector 120 defined by the front-side semiconductor layer 110, the absorption enhancement semiconductor layer 112, and the back-side semiconductor layer 114. For ease of illustration, only some of the photodetectors 120 are labeled 120.

Each photodetector 120 of the absorption enhanced pixel sensors 306a-306c comprises a first semiconductor region 120f, a second semiconductor region (not labeled), and a photo junction 120p. For ease of illustration, only some of the first semiconductor regions 120f are labeled 120f, and only some of the photo junctions 120p are labeled 120p. In some embodiments, each first semiconductor region 120f of the absorption enhanced pixel sensors 306a-306c is defined wholly or partially by a front-side CCR 110c of the front-side semiconductor layer 110, an absorption enhancement CCR 112c of the absorption enhancement semiconductor layer 112, a first back-side CCR 114c' of the back-side semiconductor layer 114, and a second back-side CCR 114c of the back-side semiconductor layer 114. For ease of illustration, only some of the front-side CCRs 110c are labeled 110c, only some of the absorption enhancement CCRs 112c are labeled 112c, only some of the first back-side CCRs 114c' are labeled 114c, and only some of the second back-side CCRs 114c are labeled 114c. In some embodiments, the second semiconductor regions of the of the absorption enhanced pixel sensors 306a-306c are defined wholly or partially by a front-side bulk region 110b of the front-side semiconductor layer 110, an absorption enhancement bulk region 112b of the absorption enhancement semiconductor layer 112, a first back-side bulk region 114b' of the back-side semiconductor layer 114, and a second back-side bulk region 114b of the back-side semiconductor layer 114. For ease of illustration, only some segments of the front-side bulk region 110b are labeled 110b, and only some segments of the absorption enhancement bulk region 112b are labeled 112b, and only some segments of the second back-side bulk region 114b are labeled 114b.

In some embodiments, a process for forming the photodetectors 120 comprises implanting dopants into the composite substrate 106 to form the first semiconductor regions 120f. In some of such embodiments, the composite substrate 106 initially has a single doping type, such that the doping is performed using dopants of an opposite doping type. The doping may, for example, be performed using ion implantation or some other doping process, and/or may, for example, use a photoresist mask to selectively implant the dopants.

Each of the absorption enhanced pixel sensors 306a-306c further comprises a transfer transistor 202. For ease of illustration, only some of the transfer transistors 202 are labeled 202. Each transfer transistor 202 of the absorption enhanced pixel sensors 306a-306c comprises a gate electrode 204, a gate dielectric layer 206, a first source/drain region (not labeled), and a second source/drain region (not labeled). For ease of illustration, only some of the gate electrodes 204 are labeled 204 and only some of the gate dielectric layers 206 are labeled 206. The first source/drain region may be defined by, for example, a respective one of the first semiconductor regions 120f of the photodetectors 120. The second source/drain region may be defined by, for example, a FDR 110f of the front-side semiconductor layer 110. The transfer transistors 202 may, for example, be as described with regard to FIG. 10. Further, the transfer transistors 202 may, for example, be formed as described with regard to FIG. 10.

Also illustrated by the cross-sectional view 1000 of FIG. 10, an isolation structure 208 is formed extending into the front-side semiconductor layer 110 to separate and surround the absorption enhanced pixel sensors 306a-306c. The isolation structure 208 may, for example, be as described with regard to FIG. 10 and/or formed as described with regard to FIG. 10.

Figure 16:
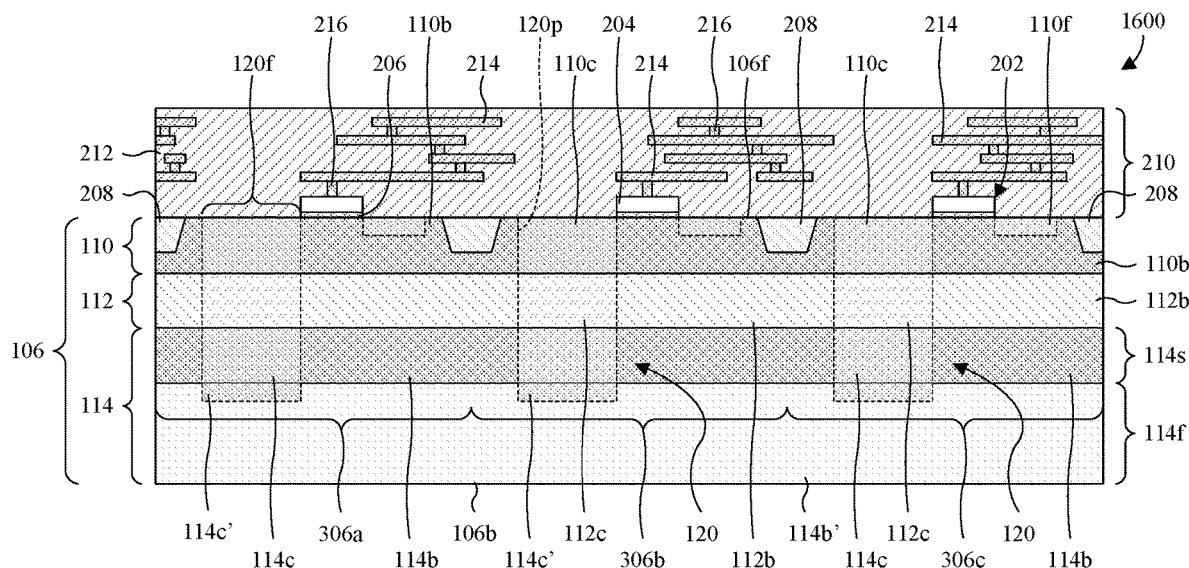

As illustrated by the cross-sectional view 1600 of FIG. 16, an interconnect structure 210 is formed covering the the absorption enhanced pixel sensors 306a-306c and the composite substrate 106. The interconnect structure 210 comprises an ILD layer 212, a plurality of wires 214, and a plurality of vias 216. For ease of illustration, only some of the wires 214 are labeled 214, and only some of the vias 216 are labeled 216. The interconnect structure 210 may, for example, be as described with regard to FIG. 11. Further, the interconnect structure 210 may, for example, be formed as described with regard to FIG. 11.

Figure 17:
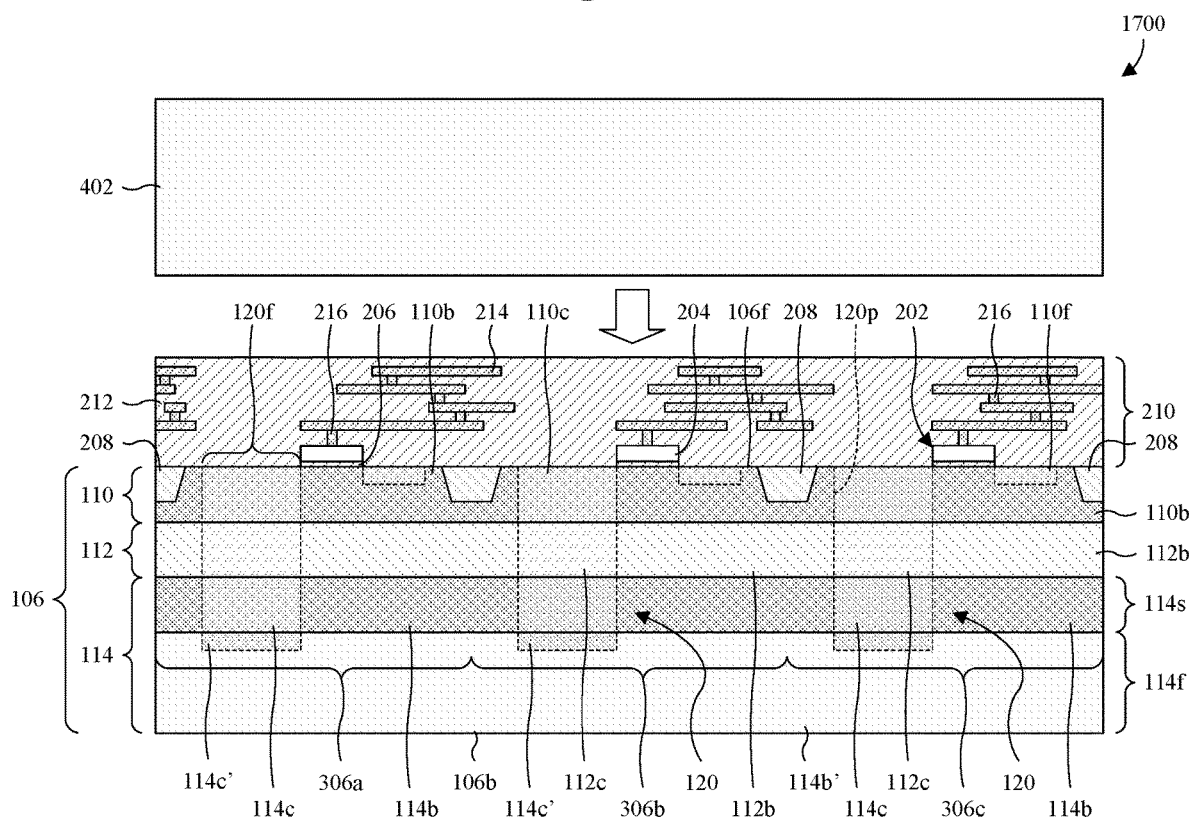

As illustrated by the cross-sectional view 1700 of FIG. 17, in some embodiments, the front-side surface 106f of the composite substrate 106 is bonded to a carrier substrate 402 through the ILD layer 212. The carrier substrate 402 may be, for example, a bulk monocrystalline silicon substrate, some other silicon substrate, a SOI substrate, a semiconductor substrate, or some other substrate. In some embodiments, the bonding process is performed by a fusion bonding process or some other bonding process.

Figure 18:
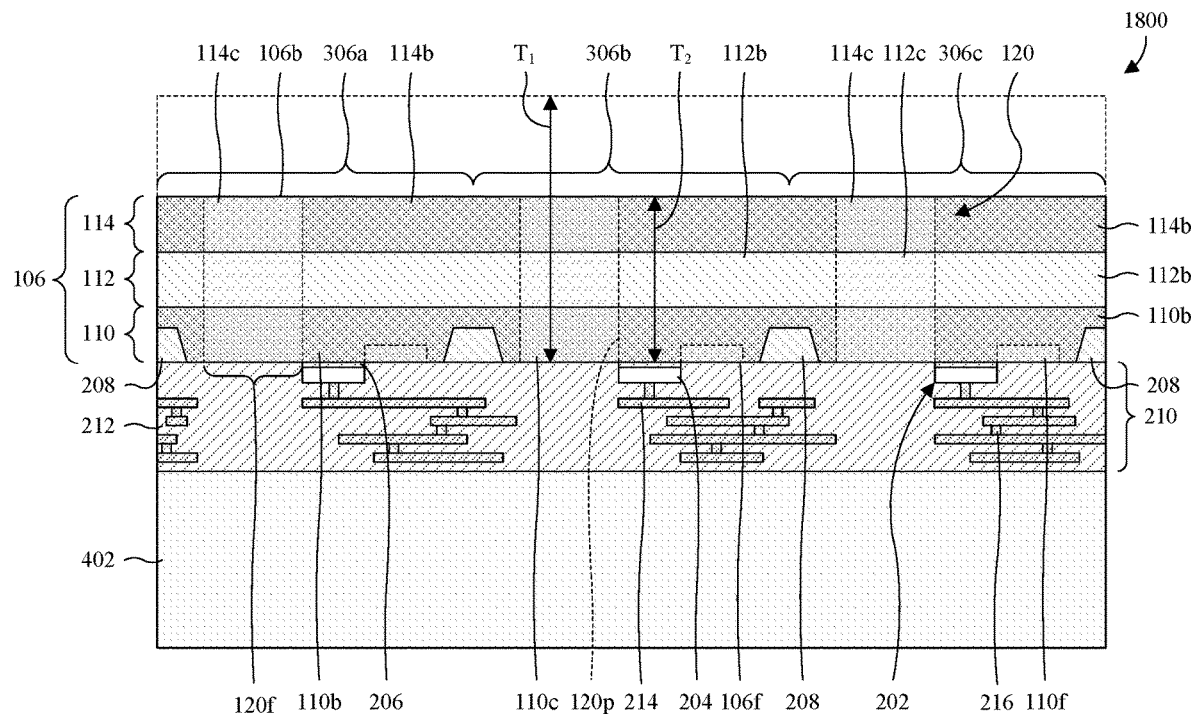

As illustrated by the cross-sectional view 1800 of FIG. 18, the structure of FIG. 17 is flipped vertically. Further, the composite substrate 106 is thinned at the back-side surface 106b of the composite substrate 106, thereby reducing a thickness of the composite substrate 106 and a thickness of the back-side semiconductor layer 114. In some embodiments, the thinning also removes the first back-side semiconductor sublayer 114f. The thinning reduces a thickness of the composite substrate 106 from a first thickness $T_1$ to a second thickness $T_2$. In some embodiments, the composite substrate 106 is thinned by performing an etch and/or a planarization into the back-side semiconductor layer 114. The planarization may, for example, be performed by a CMP or some other planarization process.

In some embodiments, the first and second back-side semiconductor sublayers 114f, 114s are the same material and have the same doping type. Further, in some of such embodiments, the first and second back-side semiconductor sublayers 114f, 114s have different doping concentrations. The different doping concentrations define a junction at an interface between the first and second back-side semiconductor sublayers 114f, 114s that may be used as a stop for the thinning, thereby allowing high degree of control over the thinning. For example, an etch may be performed as part of the thinning, where the etch uses an etchant that has a high selectivity for the first back-side semiconductor sublayer 114f relative to the second back-side semiconductor sublayer 114s, such that the junction serves as an etch stop. Such high selectivity may, for example, be between about 3:1-10:1, 10:1-20:1, 20:1-50:1, or about 3:1-50:1.

Figure 19:
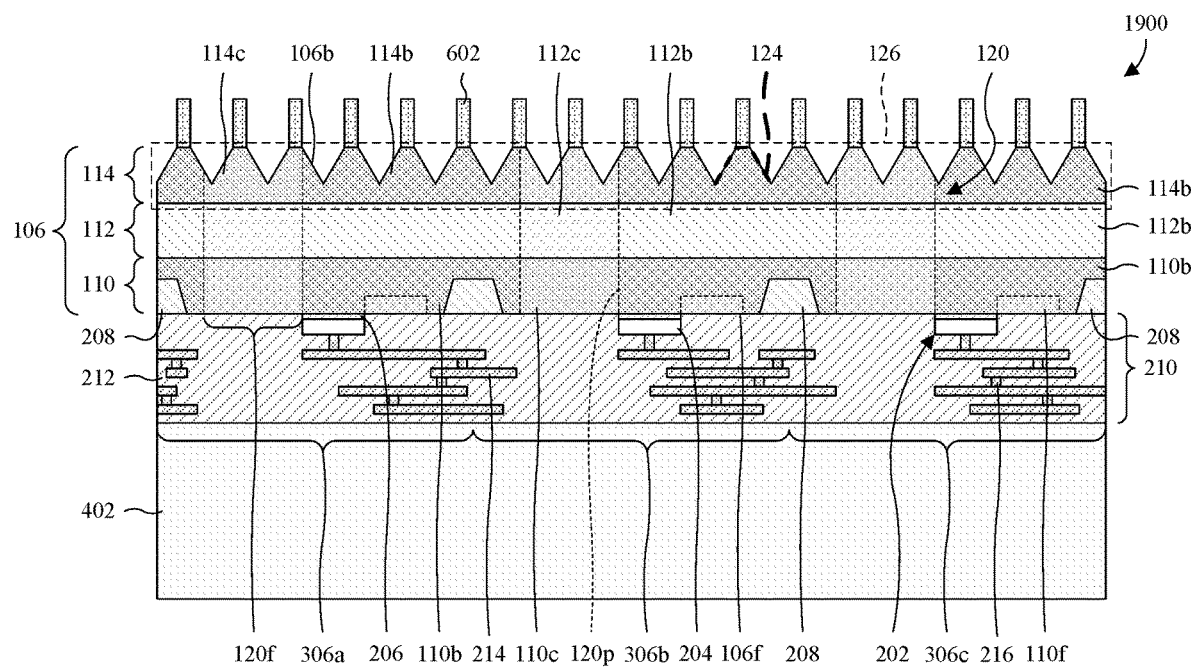

As illustrated by the cross-sectional view 1900 of FIG. 19, a plurality of protrusions 124 is formed in the composite substrate 106, including the back-side semiconductor layer 114. For ease of illustration, only one of the protrusions 124 is labeled 124. The protrusions 124 at least partially define an absorption enhancement structure 126. The protrusions 124 and the absorption enhancement structure 126 may, for example, be as described with regard to FIG. 6. Further, a process for forming the protrusions 124 may, for example, be performed as described with regard to FIG. 6. In some embodiments, the process for forming the protrusions 124 comprises performing an etch into the back-side surface 106b with a photoresist layer 602 in place, and subsequently removing the photoresist layer 602.

In some embodiments, a systematic structure of pores is formed in the back-side semiconductor layer 114. The pores may be, for example, micrometer sized pores, nanometer sized pores, smaller sized pores, or any combination of the foregoing. In some embodiments, a process for forming the systematic structure of pores comprises performing an etch into the back-side semiconductor layer 114. The process for forming the systematic structure of pores may, for example, be performed before, during, or after the process for forming the protrusions 124.

Figure 20:
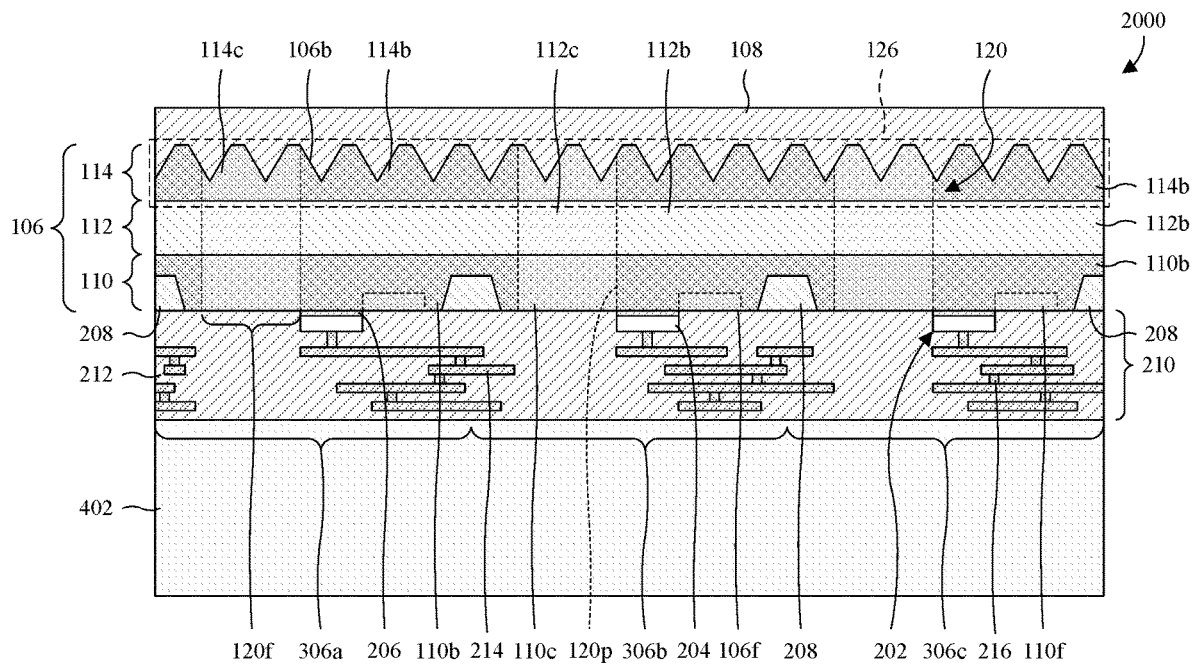

As illustrated by cross-sectional view 2000 of FIG. 20, a passivation layer 108 is formed covering the back-side surface 106b of the composite substrate 106. The passivation layer 108 may, for example, be as described with regard to FIG. 7, and/or a process for forming the passivation layer 108 may, for example, be as described with regard to FIG. 7.

Figure 21:
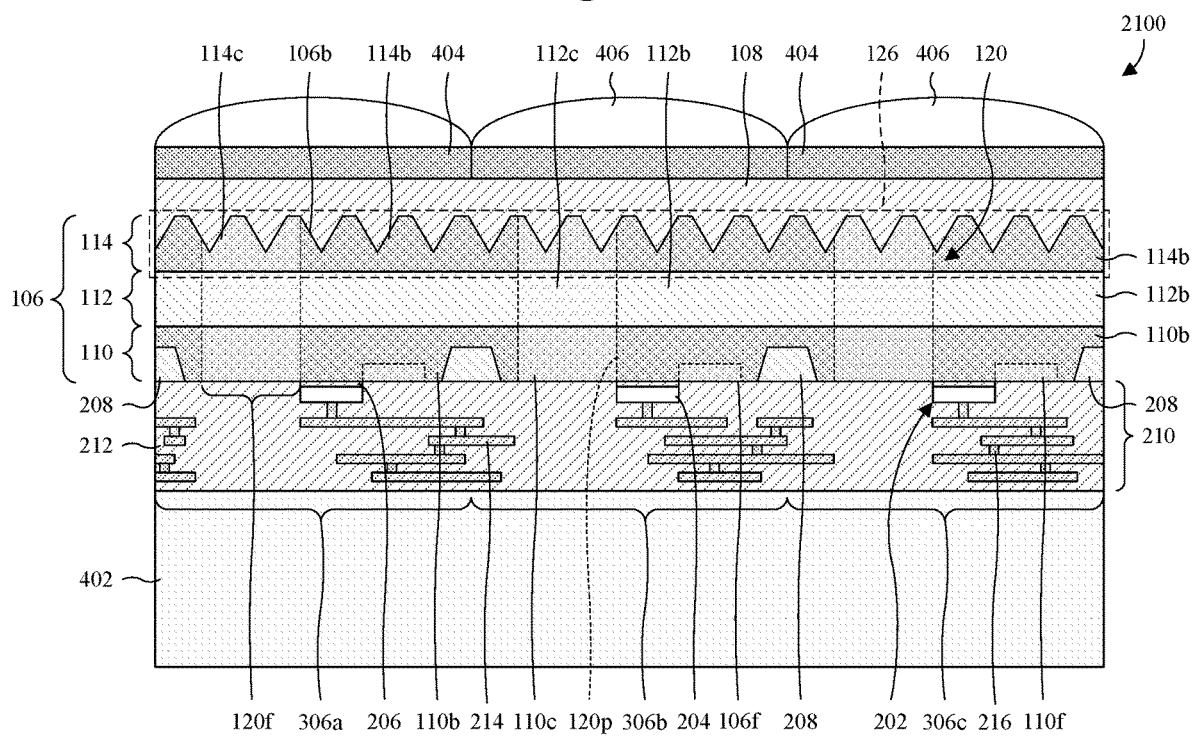

As illustrated by the cross-sectional view 2100 of FIG. 21, a plurality of color filters 404 and a plurality of micro-lenses 406 are formed on the passivation layer 108. The color filters 404 respectively overlie the absorption enhanced pixel sensors 306a-306c, and the micro-lenses 406 respectively overlie the color filters 404. The color filters 404 may, for example, be as described with regard to FIG. 12, and/or may, for example, be formed as described with regard to FIG. 12. The micro-lenses 406 may, for example, be as described with regard to FIG. 12, and/or may, for example, be formed as described with regard to FIG. 12.

Figure 22:
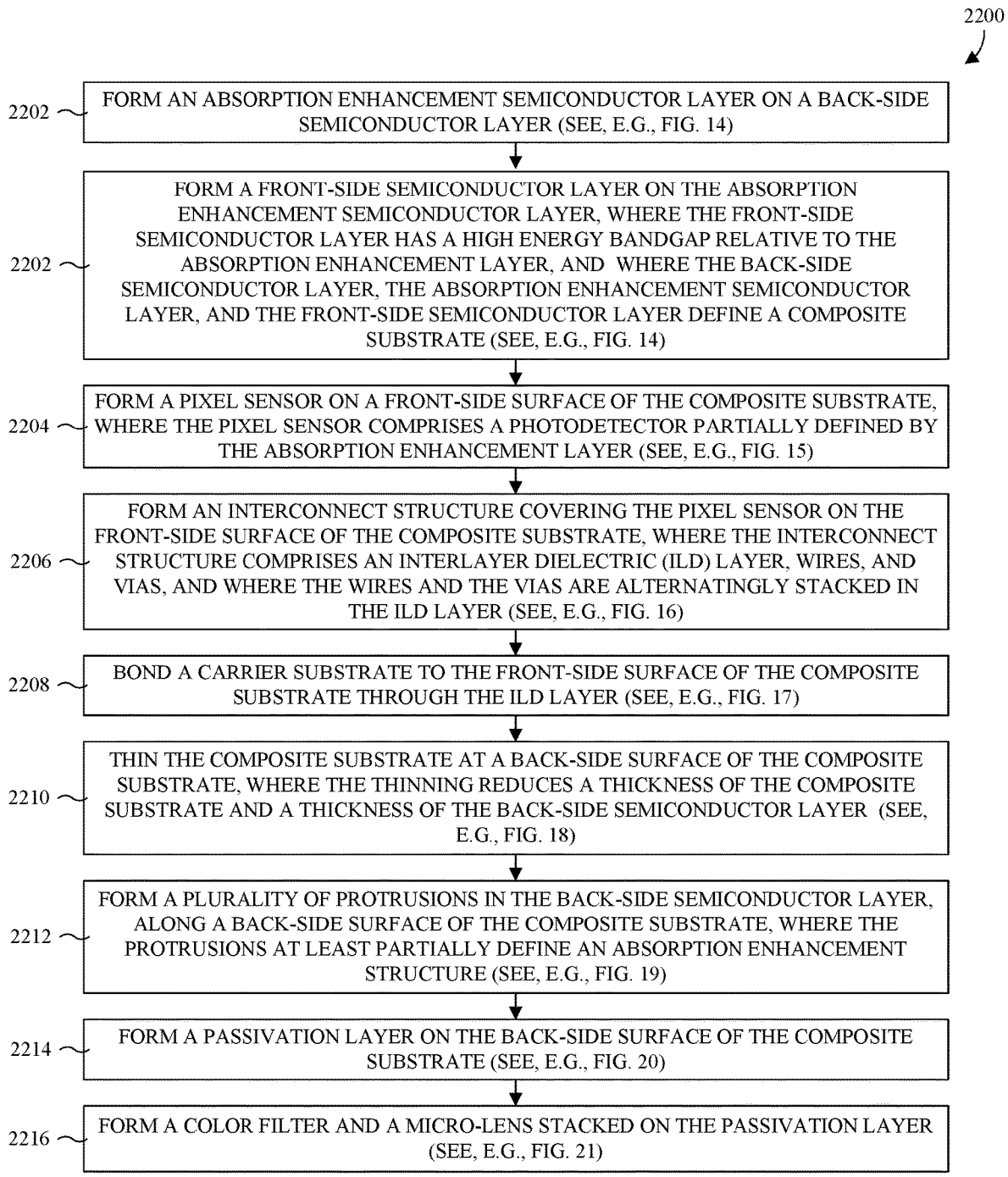
FIG. 22 illustrates a flowchart of some embodiments of the method of FIGS. 14-21.

With reference to FIG. 22, a flowchart 2200 of some embodiments of the method of FIGS. 14-21 is provided.

At 2202, a back-side semiconductor layer is formed on a semiconductor substrate. See, for example, FIG. 14.

At 2202, an absorption enhancement semiconductor layer is formed on the back-side semiconductor layer. See, for example, FIG. 14.

At 2202, a front-side semiconductor layer is formed on the absorption enhancement semiconductor layer. The front-side semiconductor layer has a high energy bandgap relative to the absorption enhancement semiconductor layer. The semiconductor substrate, the back-side semiconductor layer, the absorption enhancement semiconductor layer, and the front-side semiconductor layer define a composite substrate. See, for example, FIG. 14.

At 2204, a pixel sensor is formed on a front-side surface of the composite substrate. The pixel sensor comprises a photodetector partially defined by the absorption enhancement semiconductor layer. See, for example, FIG. 15.

At 2206, an interconnect structure is formed covering the pixel sensor on the front-side surface of the composite substrate. The interconnect structure comprises an ILD layer, wires, and vias. The wires and the vias are alternatingly stacked in the ILD layer. See, for example, FIG. 16.

At 2208, a carrier substrate is bonded to a front-side surface of the composite substrate through the ILD layer. See, for example, FIG. 17.

At 2210, the composite substrate is thinned at a back-side surface of the composite substrate. The thinning removes the semiconductor substrate. See, for example, FIG. 18.

At 2212, a plurality of protrusions is formed along the back-side surface of the composite substrate. The protrusions at least partially define an absorption enhancement structure. See, for example, FIG. 19.

At 2214, a passivation layer is formed on the back-side surface of the composite substrate. See, for example, FIG. 20.

At 2216, a color filter and a micro-lens are formed stacked on the passivation layer. See, for example, FIG. 21.

While the flowchart 2200 of FIG. 22 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an image sensor including: a front-side semiconductor layer, an absorption enhancement semiconductor layer, and a back-side semiconductor layer that are stacked, wherein the absorption enhancement semiconductor layer is stacked between the front-side and back-side semiconductor layers, and wherein the absorption enhancement semiconductor layer has an energy bandgap less than that of the front-side semiconductor layer; a plurality of protrusions defined by the back-side semiconductor layer; and a photodetector defined by the front-side semiconductor layer, the absorption enhancement semiconductor layer, and the back-side semiconductor layer. In some embodiments, the front-side semiconductor layer includes silicon, wherein the absorption enhancement semiconductor layer includes germanium or silicon germanium. In some embodiments, the front-side semiconductor layer includes silicon, wherein the absorption enhancement semiconductor layer includes silicon doped with a chalcogen. In some embodiments, the energy bandgap of the absorption enhancement semiconductor layer is less than about 1 electron volt (eV), and the energy bandgap of the front-side semiconductor layer is greater than about 1 eV. In some embodiments, the front-side semiconductor layer directly contacts the absorption enhancement semiconductor layer at a front-side heterojunction, wherein the back-side semiconductor layer directly contacts the absorption enhancement semiconductor layer at a back-side heterojunction. In some embodiments, the image sensor further includes: a front-side buffer layer between the front-side semiconductor layer and the absorption enhancement semiconductor layer; and a back-side buffer layer between the back-side semiconductor layer and the absorption enhancement semiconductor layer; wherein the front-side and back-side buffer layers include semiconductor material with an elevated concentration of carbon relative to the front-side semiconductor layer, the absorption enhancement semiconductor layer, and the back-side semiconductor layer. In some embodiments, the plurality of protrusions has a saw-toothed profile. In some embodiments, the back-side semiconductor layer includes nanoporous silicon, wherein the protrusions and the nanoporous silicon define an absorption enhancement structure with a direct energy bandgap. In some embodiments, the image sensor further includes: a transfer transistor on and partially defined by the front-side semiconductor layer, wherein the transfer transistor borders and is electrically coupled to the photodetector.

In some embodiments, the present application provides a method for manufacturing an image sensor, the method including: providing a front-side semiconductor layer, an absorption enhancement semiconductor layer, and a back-side semiconductor layer that are stacked, wherein the absorption enhancement semiconductor layer is stacked between the front-side and back-side semiconductor layers, and wherein the absorption enhancement semiconductor layer has an energy bandgap less than that of the front-side semiconductor layer; performing an etch into the back-side semiconductor layer to form a plurality of protrusions; and forming a photodetector in the front-side semiconductor layer, the absorption enhancement semiconductor layer, and the back-side semiconductor layer. In some embodiments, the etch is performed before the forming of the photodetector. In some embodiments, the method further includes: thinning the front-side semiconductor layer to reduce a thickness of the front-side semiconductor layer; and after the thinning, forming a pixel sensor on the front-side semiconductor layer, wherein the pixel sensor includes the photodetector and a transfer transistor, and wherein the transfer transistor is defined in part by the front-side semiconductor layer. In some embodiments, the etch is performed after the forming of the photodetector. In some embodiments, the method further includes: forming a pixel sensor on the front-side semiconductor layer, wherein the pixel sensor includes the photodetector and a transfer transistor, and wherein the transfer transistor is defined in part by the front-side semiconductor layer; and after the forming of the pixel sensor, thinning the back-side semiconductor layer to reduce a thickness of the back-side semiconductor layer, wherein the etch is performed after the thinning. In some embodiments, the back-side semiconductor layer includes a first back-side semiconductor sublayer and a second back-side semiconductor sublayer, wherein the second back-side semiconductor sublayer is stacked between the first back-side semiconductor sublayer and the absorption enhancement semiconductor layer, and wherein the thinning removes the first back-side semiconductor sublayer. In some embodiments, the first and second back-side semiconductor sublayers have the same material and the same doping type, wherein the first and second back-side semiconductor layers have different doping concentrations, and wherein the thinning includes etching the first back-side semiconductor sublayer until the first back-side semiconductor sublayer is removed. In some embodiments, the front-side semiconductor layer includes silicon, wherein the absorption enhancement semiconductor layer includes: 1) germanium; 2) silicon germanium; or 3) crystalline silicon doped with a chalcogen. In some embodiments, the energy bandgap of the absorption enhancement semiconductor layer is less than about 1 electron volt (eV), wherein the energy bandgap of the front-side semiconductor layer is greater than about 1 eV. In some embodiments, the protrusions are formed in a periodic pattern.

In some embodiments, the present application provides another image sensor including: a composite substrate including a front-side semiconductor layer, an absorption enhancement semiconductor layer, and a back-side semiconductor layer that are stacked, wherein the front-side semiconductor layer defines a front-side surface of the composite substrate, wherein the back-side semiconductor layer defines a back-side surface of the composite substrate that is opposite the front-side surface of the composite substrate, wherein the absorption enhancement semiconductor layer is stacked between the front-side and back-side semiconductor layers, and wherein the absorption enhancement semiconductor layer has an energy bandgap less than that of the front-side semiconductor layer; a periodic structure of protrusions defined by the back-side semiconductor layer and along the back-side surface of the composite substrate; a passivation layer directly on the back-side surface of the composite substrate, wherein the passivation layer conforms to the protrusions; and a pixel sensor directly on the front-side surface of the composite substrate, wherein the pixel sensor includes a photodetector defined by the front-side semiconductor layer, the absorption enhancement semiconductor layer, and the back-side semiconductor layer, wherein the pixel sensor includes a transfer transistor defined in part by the front-side semiconductor layer, and wherein the transfer transistor borders and is electrically coupled to the photodetector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
    a front-side semiconductor layer, an absorption enhancement semiconductor layer, and a back-side semiconductor layer that are stacked, wherein the absorption enhancement semiconductor layer is stacked between the front-side and back-side semiconductor layers, and wherein the absorption enhancement semiconductor layer has an energy bandgap less than that of the front-side semiconductor layer;
    a plurality of protrusions defined by the back-side semiconductor layer; and
    a photodetector defined by the front-side semiconductor layer, the absorption enhancement semiconductor layer, and the back-side semiconductor layer.

2. The image sensor according to claim 1, wherein the front-side semiconductor layer comprises silicon, and wherein the absorption enhancement semiconductor layer comprises germanium or silicon germanium.

3. The image sensor according to claim 1, wherein the front-side semiconductor layer comprises silicon, and wherein the absorption enhancement semiconductor layer comprises silicon doped with a chalcogen.

4. The image sensor according to claim 1, wherein the energy bandgap of the absorption enhancement semiconductor layer is less than about 1 electron volt (eV), and wherein the energy bandgap of the front-side semiconductor layer is greater than about 1 eV.

5. The image sensor according to claim 1, wherein the front-side semiconductor layer directly contacts the absorption enhancement semiconductor layer at a front-side heterojunction, and wherein the back-side semiconductor layer directly contacts the absorption enhancement semiconductor layer at a back-side heterojunction.

6. The image sensor according to claim 1, further comprising:
    a front-side buffer layer between the front-side semiconductor layer and the absorption enhancement semiconductor layer; and
    a back-side buffer layer between the back-side semiconductor layer and the absorption enhancement semiconductor layer;
    wherein the front-side and back-side buffer layers comprise semiconductor material with an elevated concentration of carbon relative to the front-side semiconductor layer, the absorption enhancement semiconductor layer, and the back-side semiconductor layer.

7. The image sensor according to claim 1, wherein the plurality of protrusions has a saw-toothed profile.

8. The image sensor according to claim 1, wherein the back-side semiconductor layer comprises nanoporous silicon, and wherein the protrusions and the nanoporous silicon define an absorption enhancement structure with a direct energy bandgap.

9. The image sensor according to claim 1, further comprising:
    a transfer transistor on and partially defined by the front-side semiconductor layer, wherein the transfer transistor borders and is electrically coupled to the photodetector.

10. An image sensor comprising:
    a composite substrate comprising a front-side semiconductor layer, an absorption enhancement semiconductor layer, and a back-side semiconductor layer that are stacked, wherein the front-side semiconductor layer defines a front-side surface of the composite substrate, wherein the back-side semiconductor layer defines a back-side surface of the composite substrate that is opposite the front-side surface of the composite substrate, wherein the absorption enhancement semiconductor layer is stacked between the front-side and back-side semiconductor layers, and wherein the absorption enhancement semiconductor layer has a higher absorption coefficient for incident radiation than the front-side semiconductor layer;
    a periodic structure of protrusions defined by the back-side semiconductor layer and along the back-side surface of the composite substrate;
    a passivation layer directly on the back-side surface of the composite substrate, wherein the passivation layer conforms to the protrusions; and
    a pixel sensor directly on the front-side surface of the composite substrate, wherein the pixel sensor comprises a photodetector defined by the front-side semiconductor layer, the absorption enhancement semiconductor layer, and the back-side semiconductor layer, wherein the pixel sensor comprises a transfer transistor defined in part by the front-side semiconductor layer, and wherein the transfer transistor borders and is electrically coupled to the photodetector.

11. The image sensor according to claim 10, wherein the back-side semiconductor layer comprises a nanoporous silicon layer and a crystalline silicon layer, wherein the crystalline silicon layer is between the nanoporous silicon layer and the absorption enhancement semiconductor layer, and wherein the nanoporous silicon layer defines the back-side surface of the composite substrate.

12. The image sensor according to claim 10, wherein the incident radiation has a wavelength greater than about 800 nanometers.

13. The image sensor according to claim 10, wherein the absorption enhancement semiconductor layer has a direct energy band gap.

14. The image sensor according to claim 10, wherein the absorption enhancement semiconductor layer comprises a semiconductor material that is supersaturated with a chalcogen.

15. The image sensor according to claim 10, wherein the composite substrate has an elevated concentration of carbon at a top surface of the absorption enhancement semiconductor layer and/or at a bottom surface of the absorption enhancement semiconductor layer.

16. The image sensor according to claim 10, wherein the passivation layer has a first surface directly contacting and conforming to the back-side surface of the composite substrate and further has a second surface on an opposite side of the passivation layer as the first surface, wherein the first surface zigzags from a first side of the pixel sensor to a second side of the pixel sensor opposite the first side, and wherein the second surface is flat from the first side to the second side.

17. An image sensor comprising:
    a first semiconductor layer and a second semiconductor layer, wherein the second semiconductor layer overlies the first semiconductor layer, wherein the first and second semiconductor layer consist essentially of silicon, wherein a surface of the first semiconductor layer has a saw-toothed profile, and wherein the surface is on an opposite side of the first semiconductor layer as the second semiconductor layer;
    a third semiconductor layer vertically between the first and second semiconductor layers, wherein the third semiconductor layer comprises silicon and further comprises germanium or a chalcogen; and a photodetector in the first, second, and third semiconductor layers.

18. The image sensor according to claim 17, wherein the photodetector comprises a PN junction spanning the first, second, and third semiconductor layers.

19. The image sensor according to claim 18, wherein the PN junction is defined by an n-type region and a p-type region, and wherein the image sensor further comprises:
a transistor on the second semiconductor layer, wherein the transistor comprises a gate electrode and further comprises a first source/drain region and a second source/drain region between which the gate electrode is sandwiched, and wherein the n-type region defines the first source/drain region.

20. The image sensor according to claim 17, wherein the first semiconductor layer comprises a systematic structure of pores along the surface of the first semiconductor layer.

* * * * *